US012697691B2

(12) United States Patent
Ono et al.

(10) Patent No.: US 12,697,691 B2
(45) Date of Patent: Aug. 4, 2026

(54) ELECTROSTATIC CHUCK

(71) Applicant: TOTO LTD., Kitakyushu (JP)

(72) Inventors: Akihito Ono, Kitakyushu (JP);
Masafumi Ikeguchi, Kitakyushu (JP);
Tomoki Umetsu, Kitakyushu (JP);
Jumpei Uefuji, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 178 days.

(21) Appl. No.: 18/121,647

(22) Filed: Mar. 15, 2023

(65) Prior Publication Data

US 2023/0311258 A1    Oct. 5, 2023

(30) Foreign Application Priority Data

Mar. 29, 2022    (JP) ................................. 2022-053877

(51) Int. Cl.
*B23Q 3/15* (2006.01)
*H01L 21/683* (2006.01)
*H10P 72/72* (2026.01)

(52) U.S. Cl.
CPC .............. *B23Q 3/15* (2013.01); *H10P 72/722* (2026.01)

(58) Field of Classification Search
CPC ........................ H01L 21/6833; H01L 21/6831
See application file for complete search history.

(56) References Cited

U.S. PATENT DOCUMENTS

| | | | |
|---|---|---|---|
| 8,226,769 B2 * | 7/2012 | Matyushkin | ...... H01L 21/67109 156/345.52 |
| 9,267,742 B2 * | 2/2016 | Bera | ......................... F28F 3/12 |
| 9,275,887 B2 * | 3/2016 | Matyushkin | ......... H05B 3/0047 |
| 9,668,373 B2 * | 5/2017 | West | .................. H01L 21/6833 |
| 10,964,577 B2 * | 3/2021 | Yamaguchi | ....... H01L 21/67109 |
| 2004/0212947 A1 | 10/2004 | Nguyen et al. | |
| 2009/0095731 A1 | 4/2009 | Asakura et al. | |
| 2013/0284372 A1 * | 10/2013 | Tavassoli | .......... H01J 37/32715 219/121.14 |
| 2017/0140956 A1 * | 5/2017 | McLaughlin | ..... H01L 21/67103 |
| 2018/0148835 A1 | 5/2018 | Erickson et al. | |
| 2018/0261486 A1 | 9/2018 | Anada et al. | |

(Continued)

FOREIGN PATENT DOCUMENTS

| | | |
|---|---|---|
| JP | 2007-335425 A | 12/2007 |
| JP | 2009-291793 A | 12/2009 |

(Continued)

*Primary Examiner* — Jason L Vaughan

(74) *Attorney, Agent, or Firm* — Carrier, Shende & Associates P.C.; Fulchand P. Shende; Joseph P. Carrier

(57) ABSTRACT

An electrostatic chuck includes a ceramic dielectric substrate and a base plate. The base plate includes a communicating path configured to allow a coolant to pass. The communicating path includes a first flow path part having a pair of side surfaces along a first direction. The first direction is along a flow of the coolant. When viewed along a stacking direction, one side surface of the pair of side surfaces includes a plurality of convex portions and a plurality of concave portions. The plurality of convex portions is convex in a second direction. The second direction is perpendicular to the first direction. The second direction is from the other side surface toward the one side surface of the pair of side surfaces. The plurality of concave portions is convex in an opposite direction of the second direction.

9 Claims, 19 Drawing Sheets

(56)  References Cited

U.S. PATENT DOCUMENTS

| | | | |
|---|---|---|---|
| 2019/0013231 A1 | 1/2019 | Yamaguchi et al. | |
| 2019/0326139 A1* | 10/2019 | Forderhase | ....... H01L 21/67109 |
| 2020/0312684 A1 | 10/2020 | Mine et al. | |
| 2022/0010428 A1 | 1/2022 | Kobayashi et al. | |

FOREIGN PATENT DOCUMENTS

| | | | |
|---|---|---|---|
| JP | 2016-115933 A | 6/2016 | |
| JP | 2017-208542 A | 11/2017 | |
| JP | 2017-208565 A | 11/2017 | |
| JP | 2018-098497 A | 6/2018 | |
| JP | 2019-110253 A | 7/2019 | |
| JP | 2020-161597 A | 10/2020 | |
| JP | 2022-016129 A | 1/2022 | |
| KR | 2020-0110461 A | 9/2020 | |
| KR | 2022-0007518 A | 1/2022 | |

* cited by examiner

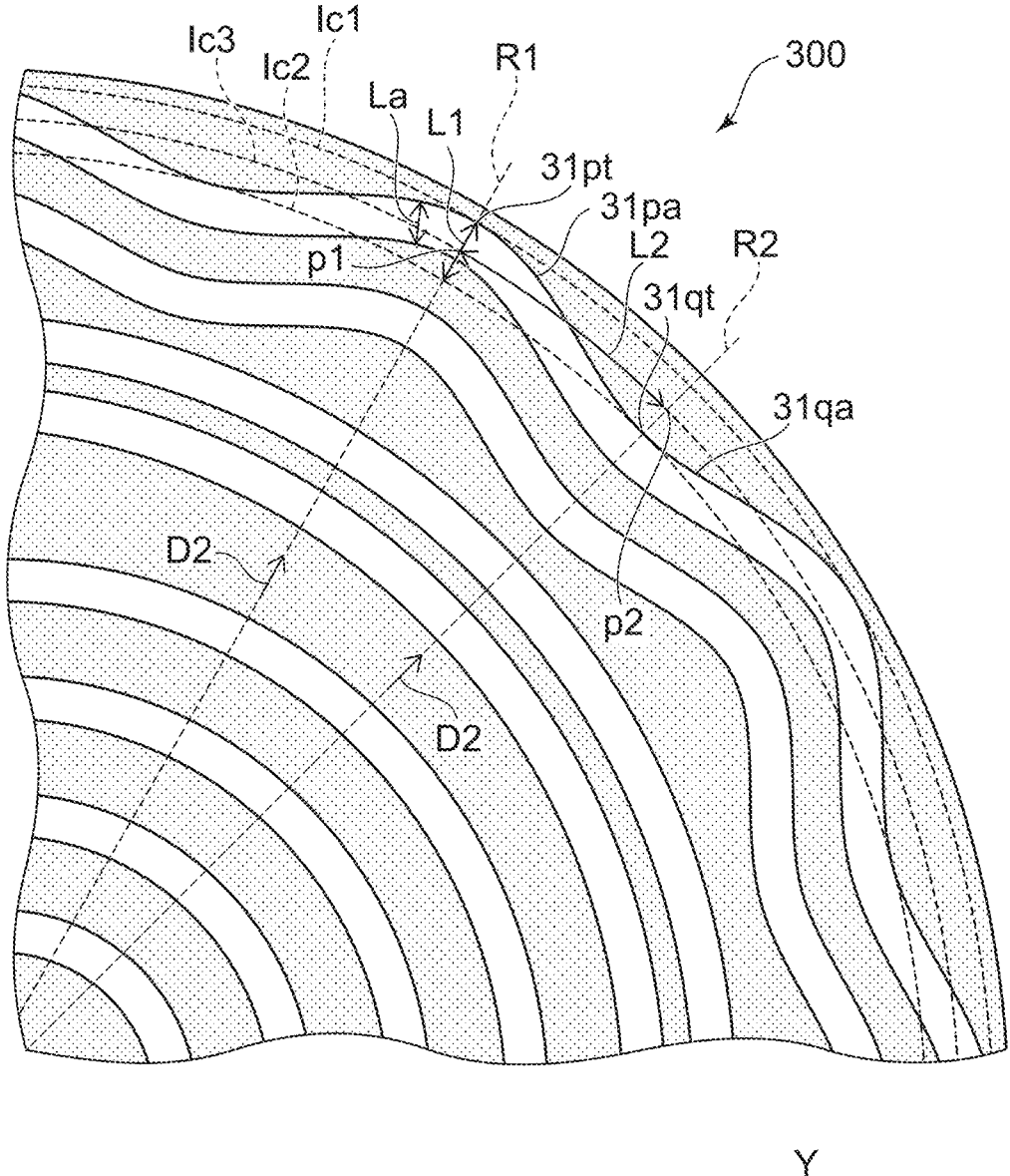
FIG. 6
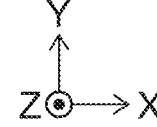

ELECTROSTATIC CHUCK

CROSS-REFERENCE TO RELATED APPLICATIONS

This application is based upon and claims the benefit of priority from Japanese Patent Application No. 2022-053877, filed on Mar. 29, 2022; the entire contents of which are incorporated herein by reference.

FIELD

Embodiments described herein relate generally to an electrostatic chuck.

BACKGROUND

An electrostatic chuck configured to have a process object such as a semiconductor wafer, a glass substrate, or the like placed thereon is known. The electrostatic chuck is used as a member for clamping and holding the process object in, for example, a plasma processing chamber of a semiconductor manufacturing apparatus in which etching, chemical vapor deposition (CVD), sputtering, ion implantation, ashing, or the like is performed. For example, the electrostatic chuck applies an electrostatic clamping power to embedded electrodes and clamps a substrate such as a silicon wafer or the like by an electrostatic force.

The electrostatic chuck includes a ceramic dielectric substrate having a placement surface on which the process object is placed, and a base plate supporting the ceramic dielectric substrate. A coolant flow path may be provided in the base plate to cool the process object.

SUMMARY

According to the embodiment, an electrostatic chuck includes a ceramic dielectric substrate and a base plate. The ceramic dielectric substrate has a placement surface configured to have a process object placed thereon. The base plate supports the ceramic dielectric substrate. The base plate has an upper surface at the ceramic dielectric substrate side, and a lower surface opposite to the upper surface. The base plate includes a communicating path located between the upper surface and the lower surface. The communicating path is configured to allow a coolant to pass. The communicating path includes a first flow path part having a pair of side surfaces along a first direction. The first direction is along a flow of the coolant. When viewed along a stacking direction of the base plate and the ceramic dielectric substrate, one side surface of the pair of side surfaces includes a plurality of convex portions and a plurality of concave portions. The plurality of convex portions is convex in a second direction. The second direction is perpendicular to the first direction. The second direction is from the other side surface toward the one side surface of the pair of side surfaces. The plurality of concave portions is convex in an opposite direction of the second direction. The plurality of convex portions and the plurality of concave portions are alternately arranged.

BRIEF DESCRIPTION OF THE DRAWINGS

FIG. 6 is a cross-sectional view schematically illustrating a portion of the electrostatic chuck according to the embodiment;

DETAILED DESCRIPTION

Figure 1:
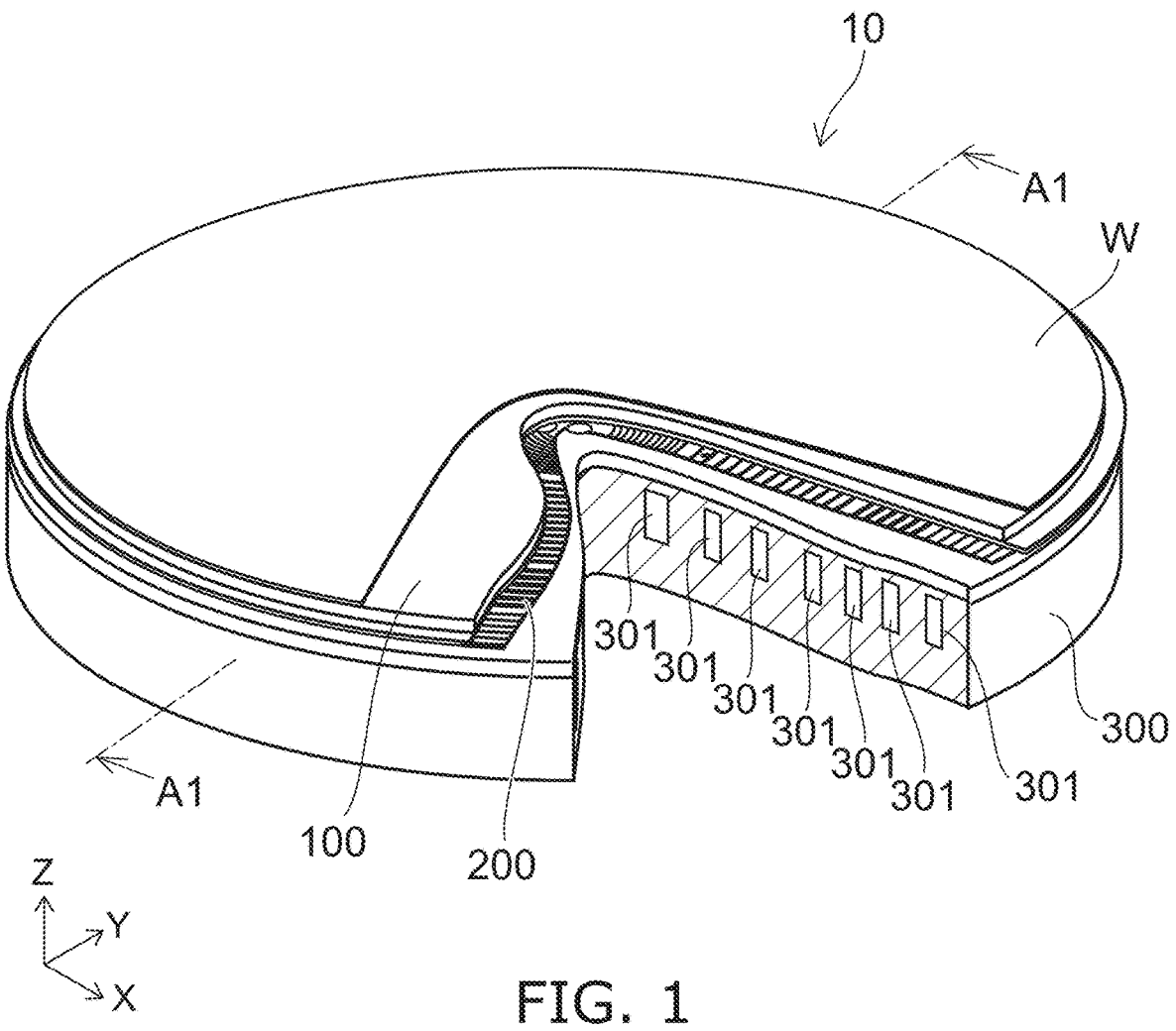
FIG. 1 is a perspective view schematically illustrating an electrostatic chuck according to an embodiment.

There are cases where the position of a coolant flow path deviates from the design in the manufacturing processes of an electrostatic chuck. For example, manufacturing fluctuation occurs in the position of the coolant flow path with respect to at least a portion of a substrate on which a process object is placed. When the position of the coolant flow path is misaligned, there is a risk of a discrepancy in which the temperature distribution in the placement surface deviates from the design.

A first invention is an electrostatic chuck including a ceramic dielectric substrate and a base plate supporting the ceramic dielectric substrate; the ceramic dielectric substrate has a placement surface configured to have a process object placed thereon; the base plate has an upper surface at the ceramic dielectric substrate side, and a lower surface opposite to the upper surface; the base plate includes a communicating path located between the upper surface and the lower surface; the communicating path is configured to allow a coolant to pass; the communicating path includes a first flow path part having a pair of side surfaces along a first direction; the first direction is along a flow of the coolant; when viewed along a stacking direction of the base plate and the ceramic dielectric substrate, one side surface of the pair of side surfaces includes multiple convex portions that are convex in a second direction, and multiple concave portions that are convex in an opposite direction of the second direction; the second direction is perpendicular to the first direction from the other side surface toward the one side surface of the pair of side surfaces; and the multiple convex portions and the multiple concave portions are alternately arranged.

According to the electrostatic chuck, the multiple convex portions and the multiple concave portions are alternately arranged in at least one side surface of the communicating path. Therefore, when the position of the communicating path deviates from the design, the deviation from the design of the temperature distribution in the placement surface of the ceramic dielectric substrate can be suppressed to be small.

A second invention is the electrostatic chuck of the first invention, wherein when viewed along the stacking direction, the other side surface of the pair of side surfaces includes multiple convex portions that are convex in the second direction, and multiple concave portions that are convex in an opposite direction of the second direction; and the multiple convex portions of the other side surface and the multiple concave portions of the other side surface are alternately arranged.

According to the electrostatic chuck, multiple convex portions and multiple concave portions are alternately arranged in both side surfaces of the communicating path. The deviation from the design of the temperature distribution in the placement surface accompanying the misalignment of the communicating path can be further suppressed thereby.

A third invention is the electrostatic chuck of the first or second invention, wherein the first direction is a circumferential direction of the base plate; the multiple convex portions of the one side surface include a first convex portion; the multiple concave portions of the one side surface include a first concave portion adjacent to the first convex portion; a first virtual circle is centered on a center of the base plate and contacts the first convex portion; a second virtual circle is centered on the center of the base plate and contacts the first concave portion; and a first distance between the first virtual circle and the second virtual circle is greater than a shortest distance between the one side surface and the other side surface.

According to the electrostatic chuck, by setting the first distance to be long, the deviation from the design of the temperature distribution in the placement surface can be suppressed even when the misalignment of the communicating path when manufacturing the electrostatic chuck is slightly large.

A fourth invention is the electrostatic chuck of the third invention, wherein the first distance is not less than 5 millimeters.

According to the electrostatic chuck, by setting the first distance to be long, the deviation from the design of the temperature distribution in the placement surface can be suppressed even when the misalignment of the communicating path when manufacturing the electrostatic chuck is slightly large.

A fifth invention is the electrostatic chuck of any one of the first to fourth inventions, wherein the first direction is a circumferential direction of the base plate; the multiple convex portions of the one side surface include a first convex portion; the multiple concave portions of the one side surface include a first concave portion adjacent to the first convex portion; a first virtual circle is centered on a center of the base plate and contacts the first convex portion; a second virtual circle is centered on the center of the base plate and contacts the first concave portion; a third virtual circle is equidistant from the first virtual circle and the second virtual circle; a first radial line is a straight line connecting the first convex portion and the center of the base plate; a second radial line is a straight line connecting the first concave portion and the center of the base plate; and a second distance along the circumferential direction between an intersection between the first radial line and the third virtual circle and an intersection between the second radial line and the third virtual circle is not less than 30 millimeters and not more than 140 millimeters.

According to the electrostatic chuck, the deviation from the design of the temperature distribution in the placement surface accompanying the misalignment of the communicating path can be further suppressed because the second distance is less than a prescribed value.

A sixth invention is the electrostatic chuck of any one of the first to fifth inventions, wherein the first direction is a circumferential direction of the base plate; and the one side surface is positioned radially outward of the other side surface in the base plate.

When the first flow path part of the communicating path extends along the circumferential direction of the base plate and the position of the first flow path part deviates from the design, there are cases where the effects on the temperature distribution due to the misalignment are greater outward of the first flow path part than inward of the first flow path part. In contrast, according to the electrostatic chuck, the multiple convex portions and the multiple concave portions are provided in the outer side surface. The deviation from the design of the temperature distribution in the placement surface outward of the first flow path part can be further suppressed thereby.

A seventh invention is the electrostatic chuck of the third or the fourth invention, wherein the communicating path includes a second flow path part having a pair of side surfaces arranged in a radial direction of the base plate; when viewed along the stacking direction, one side surface of the pair of side surfaces of the second flow path part includes multiple convex portions that are convex in the second direction, and multiple concave portions that are convex in an opposite direction of the second direction; the multiple convex portions of the second flow path part and the multiple concave portions of the second flow path part are alternately arranged; the second flow path part is positioned radially inward of the first flow path part in the base plate; the multiple convex portions of the second flow path part include a second convex portion; the multiple concave portions of the second flow path part include a second concave portion; a fourth virtual circle is centered on a center of the base plate and contacts the second convex portion; a fifth virtual circle is centered on the center of the base plate and contacts the second concave portion; a third distance is a distance between the fourth virtual circle and the fifth virtual circle; and the first distance is greater than the third distance.

When the positions of the first and second flow path parts of the communicating path extending along the circumferential direction deviate from the design, there are cases where the effects on the temperature distribution due to the misalignment are greater in the first flow path part positioned radially outward than in the second flow path part positioned radially inward in the base plate. In contrast, according to the electrostatic chuck, the deviation from the design of the temperature distribution in the placement surface at the first flow path part at the outer side can be further suppressed because the first distance of the first flow path part at the outer side is greater than the third distance of the second flow path part at the inner side.

An eighth invention is the electrostatic chuck of the fifth invention, wherein the communicating path includes a second flow path part having a pair of side surfaces arranged in a radial direction of the base plate; when viewed along the stacking direction, one side surface of the pair of side surfaces of the second flow path part includes multiple convex portions that are convex in the second direction, and multiple concave portions that are convex in an opposite direction of the second direction; the multiple convex portions of the second flow path part and the multiple concave portions of the second flow path part are alternately arranged; the second flow path part is positioned radially inward of the first flow path part in the base plate; the multiple convex portions of the second flow path part include a second convex portion; the multiple concave portions of the second flow path part include a second concave portion; a fourth virtual circle is centered on the center of the base plate and contacts the second convex portion; a fifth virtual circle is centered on the center of the base plate and contacts the first concave portion; a sixth virtual circle is equidistant from the fourth virtual circle and the fifth virtual circle; a third radial line is a straight line connecting the second convex portion and the center of the base plate; a fourth radial line is a straight line connecting the second concave portion and the center of the base plate; a fourth distance is a distance along the circumferential direction between an intersection between the sixth virtual circle and the third radial line and an intersection between the fourth radial line and the sixth virtual circle; and the second distance is less than the fourth distance.

According to the electrostatic chuck, the deviation from the design of the temperature distribution in the placement surface at the first flow path part at the outer side can be further suppressed because the second distance (e.g., the meandering period) of the first flow path part at the outer side is less than the fourth distance (e.g., the meandering period) of the second flow path part at the inner side.

A ninth invention is the electrostatic chuck of the first or second invention, wherein the first direction is a linear direction; the multiple convex portions of the one side surface include a first convex portion; the multiple concave portions of the one side surface include a first concave portion adjacent to the first convex portion; a first straight line extends in the first direction and contacts the first convex portion; a second straight line extends in the first direction and contacts the first concave portion; and a fifth distance between the first straight line and the second straight line is greater than a shortest distance between the one side surface and the other side surface.

According to the electrostatic chuck, by setting the fifth distance (e.g., the meandering amount of the side surface of the communicating path) to be long, the deviation from the design of the temperature distribution in the placement surface can be suppressed even when the misalignment of the communicating path when manufacturing the electrostatic chuck is slightly large.

A tenth invention is the electrostatic chuck of the ninth invention, wherein the fifth distance is not less than 5 millimeters.

According to the electrostatic chuck, by setting the fifth distance (e.g., the meandering amount of the side surface of the communicating path) to be long, the deviation from the design of the temperature distribution in the placement surface can be suppressed even when the misalignment of the communicating path when manufacturing the electrostatic chuck is slightly large.

An eleventh invention is the electrostatic chuck of the first or second invention, wherein the first direction is a linear direction; the multiple convex portions of the one side surface include a first convex portion; the multiple concave portions of the one side surface include a first concave portion adjacent to the first convex portion; a first straight line extends in the first direction and contacts the first convex portion; a second straight line extends in the first direction and contacts the first concave portion; a third straight line is a straight line equidistant from the first straight line and the second straight line; a first perpendicular line is a straight line that passes through the first convex portion and is perpendicular to the first straight line; a second perpendicular line is a straight line that passes through the first concave portion and is perpendicular to the second straight line; and a sixth distance between an intersection between the first perpendicular line and the third straight line and an intersection between the second perpendicular line and the third straight line is not less than 30 millimeters and not more than 140 millimeters.

According to the electrostatic chuck, the deviation from the design of the temperature distribution in the placement surface accompanying the misalignment of the communicating path can be further suppressed because the sixth distance (e.g., the meandering period of the side surface of the communicating path) is short.

A twelfth invention is the electrostatic chuck of any one of the first to eleventh inventions, further including a heater unit located inside the ceramic dielectric substrate or between the ceramic dielectric substrate and the base plate; the heater unit heats the ceramic dielectric substrate; the heater unit includes a heater line; the heater line has a pair of sides extending along an extension direction of the heater line; and at least a portion of one of the pair of sides overlaps the first flow path part in the stacking direction.

When the position of the communicating path cooling the placement surface deviates from the design with respect to the heater unit heating the placement surface, the deviation from the design of the temperature distribution in the placement surface is likely to increase. In contrast, according to the electrostatic chuck, at least a portion of the one side of the heater overlaps the first flow path part of the communicating path; therefore, the deviation from the design of the temperature distribution in the placement surface can be further suppressed when the position of the communicating path deviates from the design with respect to the heater unit.

A thirteenth invention is the electrostatic chuck of the twelfth invention, wherein the extension direction is the same direction as the first direction.

According to the electrostatic chuck, the multiple concave portions and the multiple convex portions of the first flow path part are alternately arranged along the extension direction of the heater line. Accordingly, the deviation from the design of the temperature distribution in the placement surface can be further suppressed when the position of the communicating path deviates from the design with respect to the heater unit.

Hereinafter, embodiments of the invention will be described with reference to the drawings. It is noted that, in each figure, similar components are denoted by the same reference numerals, and detailed description thereof will be omitted as appropriate.

FIG. 1 is a perspective view schematically illustrating an electrostatic chuck according to an embodiment.

Figure 2A:
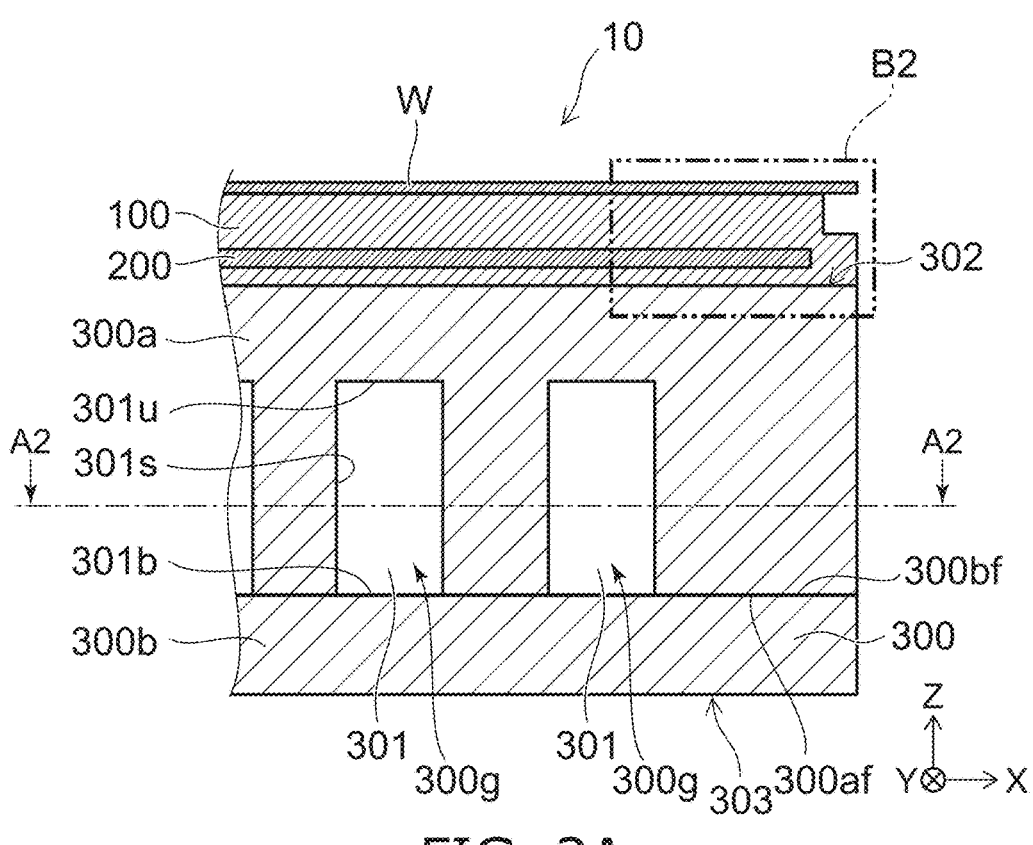
FIGS. 2A and 2B are cross-sectional views schematically illustrating a portion of the electrostatic chuck according to the embodiment.
Figure 2B:
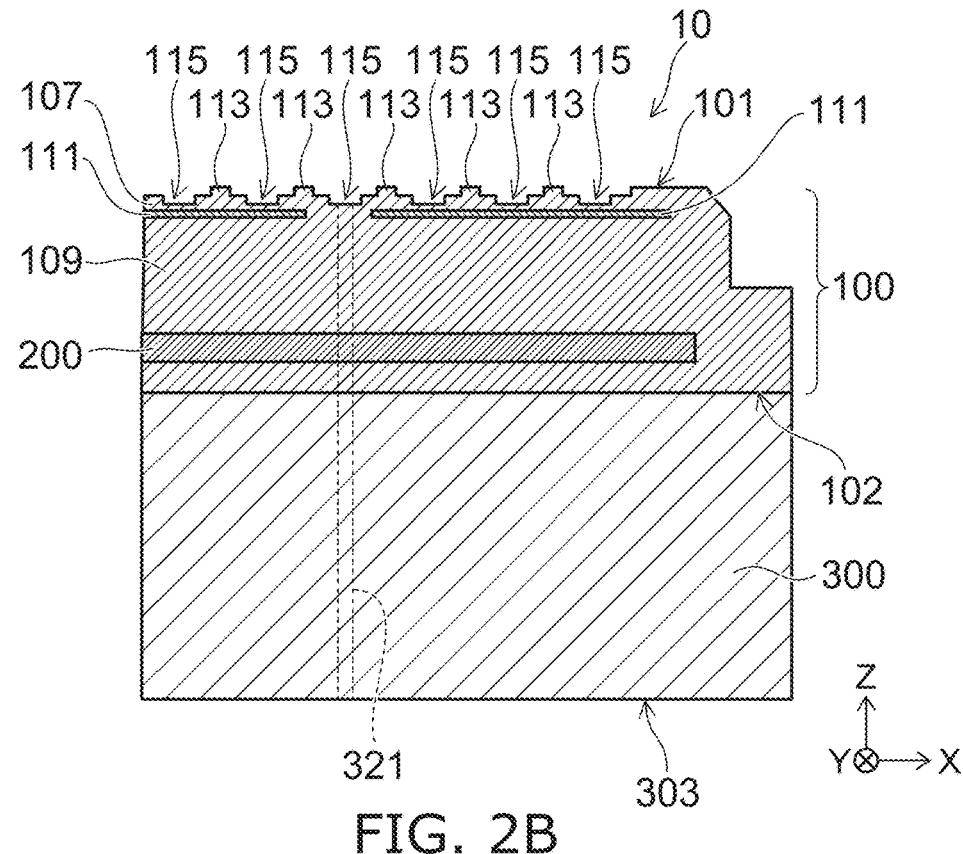

FIGS. 2A and 2B are cross-sectional views schematically illustrating a portion of the electrostatic chuck according to the embodiment.

In FIG. 1, for the convenience of description, a cross-sectional view is illustrated in a portion of the electrostatic chuck.

FIG. 2A is a cross-sectional view taken along line A1-A1 illustrated in FIG. 1.

FIG. 2B is an enlarged view of a region B1 illustrated in FIG. 2A. In FIG. 2B, a process object W is omitted.

As illustrated in FIGS. 1, 2A, and 2B, the electrostatic chuck 10 according to the embodiment includes a ceramic dielectric substrate 100, a heater unit 200, and a base plate 300.

The ceramic dielectric substrate 100 is, for example, a flat plate-shaped base material made of a polycrystalline ceramic sintered body and has a first major surface 101 on which a process object W such as a semiconductor wafer is mounted and a second major surface 102 which is a side opposite to the first major surface 101.

In the specification, the direction perpendicular to the first major surface 101 is defined as a Z-direction. In other words, the Z-direction is a direction connecting the first major surface 101 and the second major surface 102. In other words, the Z-direction is a direction from the base plate 300 toward the ceramic dielectric substrate 100. One of the directions orthogonal to the Z-direction is defined as an X-direction, and the direction orthogonal to the Z-direction and the X-direction is defined as a Y-direction. In the specification, "in-plane" denotes, for example, in an XY plane. In the specification, "plan view" indicates a state viewed along the Z-direction.

$Al_2O_3$, $Y_2O_3$, YAG, and the like are examples of the crystal material included in the ceramic dielectric substrate 100. Such a material is allowed to be used, so that infrared transmittance, dielectric strength, and plasma durability of the ceramic dielectric substrate 100 can be improved.

An electrode layer 111 is provided inside the ceramic dielectric substrate 100. The electrode layer 111 is interposed between the first major surface 101 and the second major surface 102. That is, the electrode layer 111 is formed so as to be inserted into the ceramic dielectric substrate 100. The electrode layer 111 is integrally sintered on the ceramic dielectric substrate 100.

The electrode layer 111 is not limited to being interposed between the first major surface 101 and the second major surface 102, and the electrode layer 111 may be attached to the second major surface 102.

The electrostatic chuck 10 generates charges on the first major surface 101 side of the electrode layer 111 by applying a clamping voltage to the electrode layer 111 and clamps the process object W by the electrostatic force.

The electrode layer 111 is provided along the first major surface 101 and the second major surface 102. The electrode layer 111 is a clamping electrode for clamping the process object W. The electrode layer 111 may be of a unipolar type or a bipolar type. The electrode layer 111 may be of a tripolar type or of a multipolar type. The number of electrode layers 111 and the arrangement of the electrode layers 111 are appropriately selected.

The base plate 300 is provided on the second major surface 102 side of the ceramic dielectric substrate 100 and supports the ceramic dielectric substrate 100. A communicating path 301 is provided to the base plate 300. That is, the communicating path 301 is provided inside the base plate 300. Aluminum is an example of the material of the base plate 300.

The base plate 300 serves to adjust the temperature of the ceramic dielectric substrate 100. For example, in the case of cooling the ceramic dielectric substrate 100, a cooling medium is allowed to flow into the communicating path 301, pass through the communicating path 301, and flow out from the communicating path 301. Accordingly, the heat of the base plate 300 can be absorbed by the cooling medium, and the ceramic dielectric substrate 100 mounted on the base plate 300 can be cooled.

In the example as illustrated in FIG. 2A, the base plate 300 includes an upper material 300a and a lower material 300b. The upper material 300a is located on the lower material 300b. An upper surface 300bf of the lower material 300b has a planar configuration. A groove 300g (a concave portion) that forms the communicating path 301 is provided in a lower surface 300af of the upper material 300a. The communicating path 301 is formed by bonding the lower surface 300af of the upper material 300a and the upper surface 300bf of the lower material 300b to each other. In other words, a portion of the upper surface 300bf of the lower material 300b is used as a lower surface 301b (the bottom surface) of the communicating path 301. The inner surface of the groove 300g of the upper material 300a is used as an upper surface 301u and a side surface 301s of the communicating path 301. The side surface 301s crosses the X-Y plane.

Convex portions 113 are provided on the first major surface 101 side of the ceramic dielectric substrate 100, as needed. Grooves 115 are provided between the adjacent convex portions 113. The grooves 115 communicate with each other. A space is formed between the grooves 115 and a back side of the process object W mounted on the electrostatic chuck 10.

An introduction path 321 penetrating the base plate 300 and the ceramic dielectric substrate 100 is connected to the groove 115. When a transfer gas such as helium (He) is introduced from the introduction path 321 in a state where the process object W is clamped and held, the transfer gas flows into the space provided between the process object W and the groove 115, and the process object W can be directly heated or cooled by the transfer gas.

The heater unit 200 heats the ceramic dielectric substrate 100. The heater unit 200 heats the ceramic dielectric substrate 100 to heat the process object W via the ceramic dielectric substrate 100. In the example, the heater unit 200 is separate from the ceramic dielectric substrate 100 and is provided between the ceramic dielectric substrate 100 and the base plate 300.

Figure 3A:
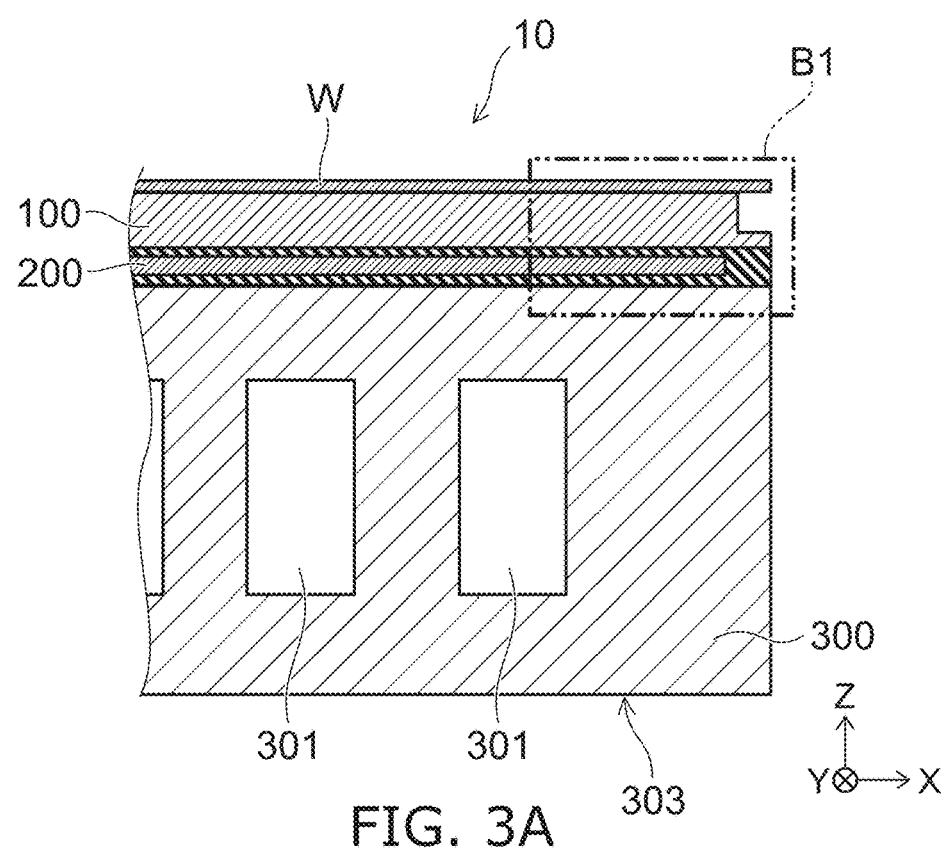
FIGS. 3A and 3B are cross-sectional views schematically illustrating a portion of an electrostatic chuck according to a modification of the embodiment.
Figure 3B:
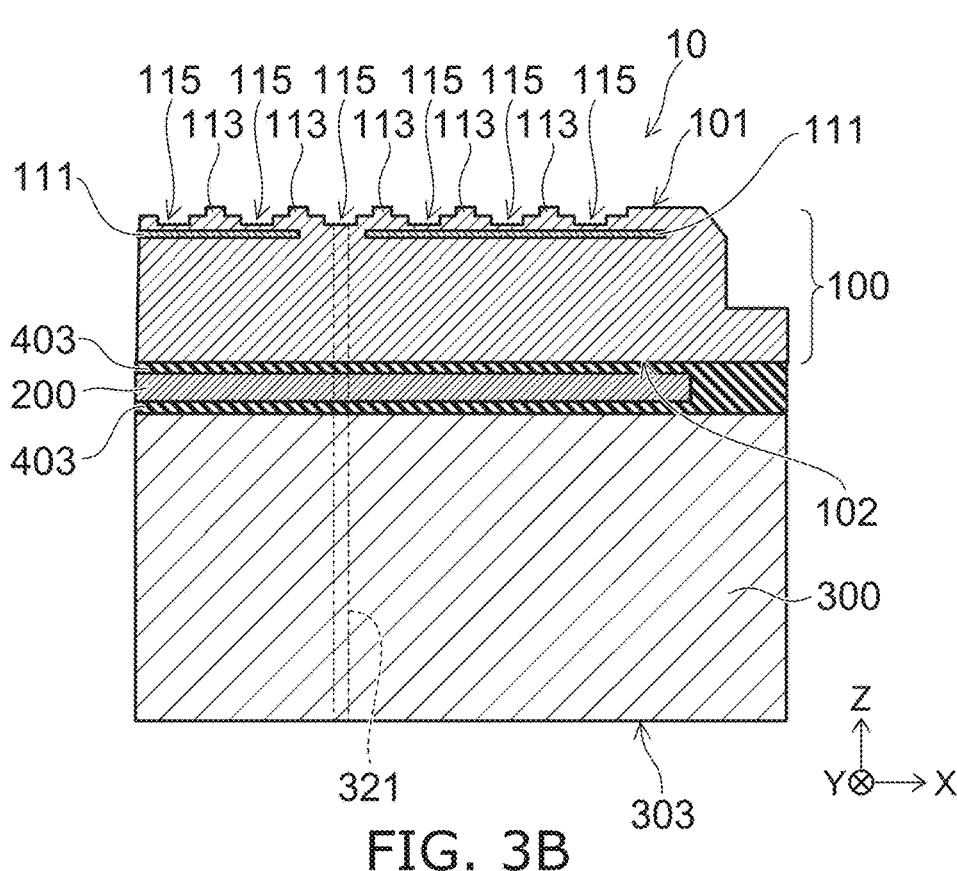

FIGS. 3A and 3B are cross-sectional views schematically illustrating a portion of an electrostatic chuck according to a modification of the embodiment.

FIG. 3B is an enlarged view of region B1 shown in FIG. 3A. The process object W is not illustrated in FIG. 3B.

As illustrated in FIGS. 3A and 3B, the heater unit 200 may be provided separately from the ceramic dielectric substrate 100. The heater unit 200 is located between the ceramic dielectric substrate 100 and the base plate 300.

An adhesive layer 403 is provided between the base plate 300 and the heater unit 200. The adhesive layer 403 is provided between the heater unit 200 and the ceramic dielectric substrate 100. Heat-resistant resins such as silicone having relatively high thermal conductivity are examples of the material of the adhesive layer 403. The thickness of the adhesive layer 403 is, for example, not less than about 0.1 millimeters (mm) and not more than about 1.0 mm. The thickness of the adhesive layer 403 is the same as the distance between the base plate 300 and the heater unit 200 or the distance between the heater unit 200 and the ceramic dielectric substrate 100.

Figure 4:
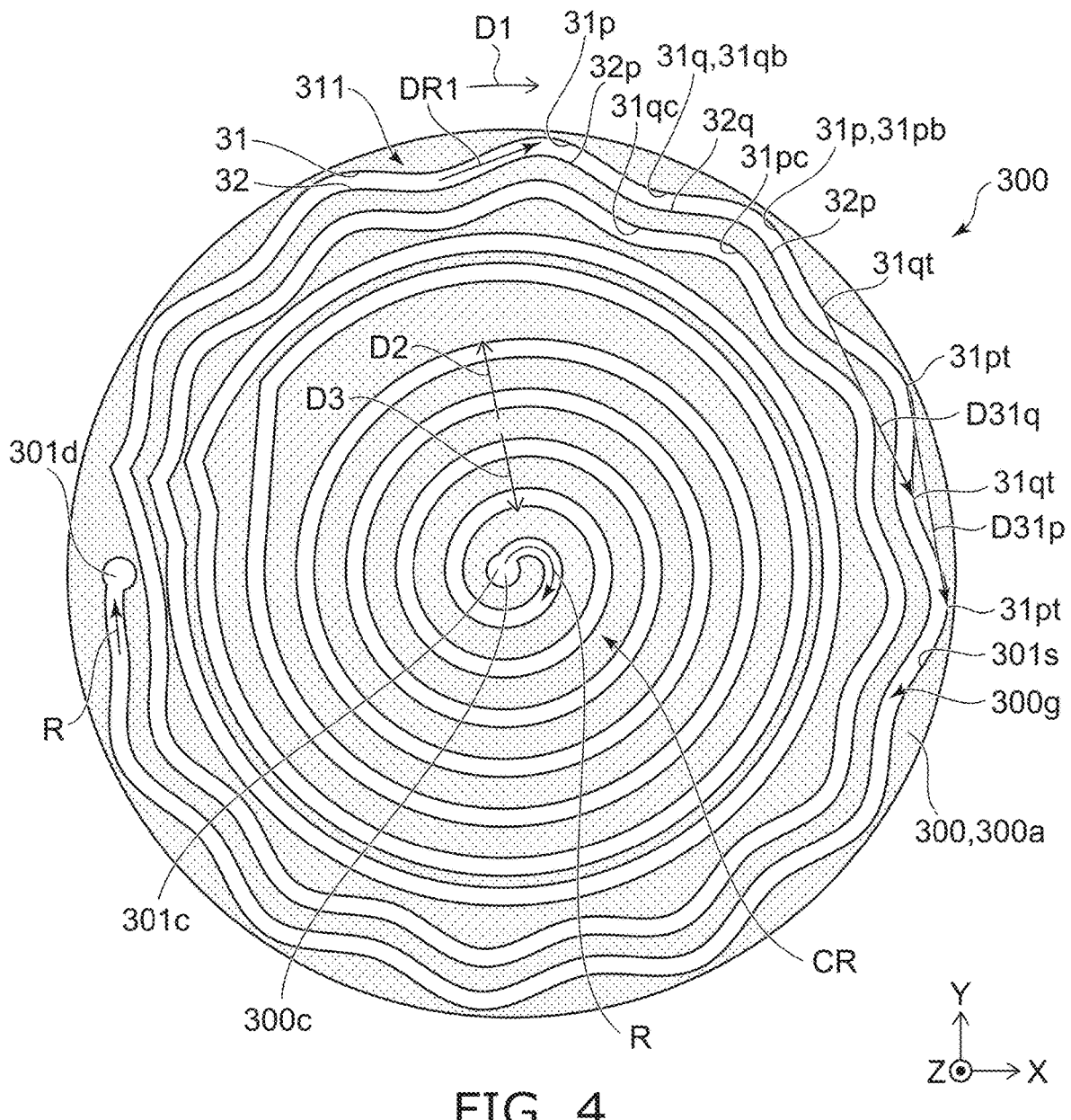
FIG. 4 is a cross-sectional view schematically illustrating a portion of the electrostatic chuck according to the embodiment.

FIG. 4 is a cross-sectional view schematically illustrating a portion of the electrostatic chuck according to the embodiment.

FIG. 4 corresponds to the cross section along line A2-A2 shown in FIGS. 2A and 2B and illustrates the planar shape when the base plate 300 and the communicating path 301 are viewed from above. The planar shape of the base plate 300 is, for example, circular. The scope of circular includes not only perfectly circular but also substantially circular.

One end 301c of the communicating path 301 is positioned at a center 300c vicinity of the planar shape of the base plate 300. Another end 301d of the communicating path 301 is positioned at the outer circumference portion of the planar shape of the base plate 300. When viewed along the stacking direction, the communicating path 301 has a spiral shape connecting the one end 301c and the other end 301d. For example, a coolant R flows into the communicating path 301 through the one end 301c, flows through the spiral-shaped communicating path 301, and flows out of the communicating path 301 through the other end 301d. Conversely, the coolant R may flow into the communicating path 301 through the other end 301d, flow through the communicating path 301, and flow out of the communicating path 301 through the one end 301c.

According to the embodiment, at least a portion of the communicating path 301 meanders. For example, the communicating path 301 includes a first flow path part 311 that extends while meandering along a first direction D1. The first direction D1 is a direction perpendicular to the stacking direction of the base plate 300 and the ceramic dielectric substrate 100 (i.e., the Z-direction). In the example, the first direction D1 is the circumferential direction (the direction on the circumference centered on the center 300c) of the planar shape of the base plate 300. The first direction D1 is, for example, a direction along the flow of the coolant. For example, the direction in which the coolant flows (the path in which the coolant flows) through the communicating path 301 is along the first direction D1.

In the example, the first flow path part 311 is located in a region outward of a central region CR of the base plate 300. The central region CR is, for example, an area within a prescribed radius centered on the center 300c when viewed in plan. The prescribed radius is, for example, half of the radius of the base plate 300. The first flow path part 311 is a portion of the outermost circumference of the spiral-shaped communicating path 301. However, the first flow path part 311 may be located in the central region CR.

The first flow path part 311 is provided so as to surround the center 300c. For example, the first flow path part 311 makes one turn around the center 300c and surrounds the entire circumference of the center 300c. The first flow path part 311 may have a circular arc shape (one portion of a spiral shape or an annular shape) or may surround the center 300c one or more turns (e.g., not less than about 2 to 4 turns).

The outer circumference (the end portion (the outer edge) in the X-Y plane) of the communicating path 301 may overlap, in the Z-direction, the outer circumference of the process object W placed on the ceramic dielectric substrate 100. When viewed in plan, the outer circumference of the communicating path 301 may be inside or outside the outer circumference of the process object W placed on the ceramic dielectric substrate 100.

The first flow path part 311 has a pair of side surfaces (inner wall surfaces) crossing the X-Y plane. For example, the pair of side surfaces extends along the first direction D1. For example, the pair of side surfaces each extends along the first direction D1 while meandering. Specifically, the first flow path part 311 has a first side surface 31 and a second side surface 32. The first side surface 31 and the second side surface 32 are portions of the side surfaces 301s of the communicating path 301.

The scope of the flow path parts (the first flow path part 311, a second flow path part 312 described below, etc.) or the side surfaces (the first side surface 31, the second side surface 32, a third side surface 33 described below, a fourth side surface 34 described below, etc.) being along the first direction D1 includes the case where the flow path part or the side surface extends along the first direction D1 while meandering. When the first direction D1 is the circumferential direction of the base plate 300, a shape in which the flow path part or the side surface extends away from the center 300c (or approaches the center 300c) while gradually revolving around the center 300c of the base plate 300 also is within the scope of the flow path part or the side surface being along the first direction D1. For example, when the flow path part is a portion of a spiral shape centered on the center 300c of the base plate 300, the flow path part or the side surface extends along the circumferential direction of the base plate 300.

A case where the first side surface 31 is the outer side surface in the base plate 300 and the second side surface 32 is the inner side surface in the base plate 300 will now be described. That is, the second side surface 32 is positioned between the first side surface 31 and the center 300c of the base plate 300. However, the first side surface 31 may be the inner side surface in the base plate 300; and the second side surface 32 may be the outer side surface in the base plate.

The first side surface 31 and the second side surface 32 face each other and extend in the X-Y plane. The coolant flows between the first side surface 31 and the second side surface 32. For example, the first side surface 31 faces the second side surface 32 in the radial direction of the planar shape of the base plate 300.

At least one of the pair of side surfaces of the communicating path 301 meanders. That is, when viewed along the Z-direction, one of the pair of side surfaces (the first side surface 31 and the second side surface 32) of the communicating path 301 includes multiple convex portions and multiple concave portions. For example, the first side surface 31 includes multiple convex portions 31p and multiple concave portions 31q. The multiple convex portions 31p each are convex in a second direction D2. The multiple concave portions 31q each are convex in a direction D3 opposite to the second direction D2. The second direction D2 is a direction in the X-Y plane perpendicular to the first direction D1. The second direction D2 is a direction from the other (the second side surface 32) toward the one (the first side surface 31) of the pair of side surfaces of the communicating path 301. In the example, the second direction is the radial direction of the planar shape of the base plate 300 from the center 300*c* of the base plate 300 toward the outer circumference of the base plate 300. In other words, for example, the convex portion 31*p* is outwardly convex in the base plate 300 (e.g., is convex in a direction from the center toward the outer edge of the base plate 300) when viewed in plan. For example, the concave portion 31*q* is inwardly convex in the base plate 300 (e.g., is convex in a direction from the outer edge toward the center of the base plate 300) when viewed in plan.

The multiple convex portions 31*p* and the multiple concave portions 31*q* are alternately arranged along the path through which the coolant flows through the communicating path 301. The multiple convex portions 31*p* and the multiple concave portions 31*q* are alternately arranged along the first direction D1. For example, the multiple convex portions 31*p* are arranged along the first direction D1; and the multiple concave portions 31*q* are arranged along the first direction D1. One concave portion 31*q* connects two convex portions 31*p* among the multiple convex portions 31*p* most proximate to each other in the first direction D1. One convex portion 31*p* connects two concave portions 31*q* among the multiple concave portions 31*q* most proximate to each other in the first direction D1.

In the example, both of the pair of side surfaces of the communicating path 301 meander. That is, when viewed along the Z-direction, the other side surface of the pair of side surfaces (the first side surface 31 and the second side surface 32) of the communicating path 301 includes multiple convex portions and multiple concave portions. In other words, the second side surface 32 includes multiple convex portions 32*p* and multiple concave portions 32*q*. The multiple convex portions 32*p* each are convex in the second direction D2. The multiple concave portions 32*q* each are convex in the direction D3 opposite to the second direction D2. In other words, for example, the convex portion 32*p* is outwardly convex in the base plate 300 (e.g., is convex in a direction from the center toward the outer edge of the base plate 300) when viewed in plan. For example, the concave portion 32*q* is inwardly convex in the base plate 300 (e.g., is convex in a direction from the outer edge toward the center of the base plate 300) when viewed in plan.

The multiple convex portions 32*p* and the multiple concave portions 32*q* are alternately arranged along the path through which the coolant flows through the communicating path 301. The multiple convex portions 32*p* and the multiple concave portions 32*q* are alternately arranged along the first direction D1.

The convex portion 31*p*, the concave portion 31*q*, the convex portion 32*p*, and the concave portion 32*q* each are curves (e.g., circular arcs) when viewed in plan. However, the convex portion 31*p*, the concave portion 31*q*, the convex portion 32*p*, and the concave portion 32*q* each may include linear portions at least partially. A portion that extends along the first direction D1 may be located between the convex portion 31*p* and the concave portion 31*q*. A portion that extends along the first direction D1 may be located between the convex portion 32*p* and the concave portion 32*q*.

For example, the multiple convex portions 31*p* include a convex portion 31*pb* and a convex portion 31*pc*. The convex portion 31*pc* is positioned inward of the convex portion 31*pb* in the base plate 300. For example, the convex portion 31*pc* is arranged with the convex portion 31*pb* in the second direction D2. However, the convex portion 31*pc* may not be arranged with the convex portion 31*pb* in the second direction D2.

For example, the multiple concave portions 31*q* include a concave portion 31*qb* and a concave portion 31*qc*. The concave portion 31*qc* is positioned inward of the concave portion 31*qb* in the base plate 300. For example, the concave portion 31*qc* is arranged with the concave portion 31*qb* in the second direction D2. However, the concave portion 31*qc* may not be arranged with the concave portion 31*qb* in the second direction D2.

Figure 5:
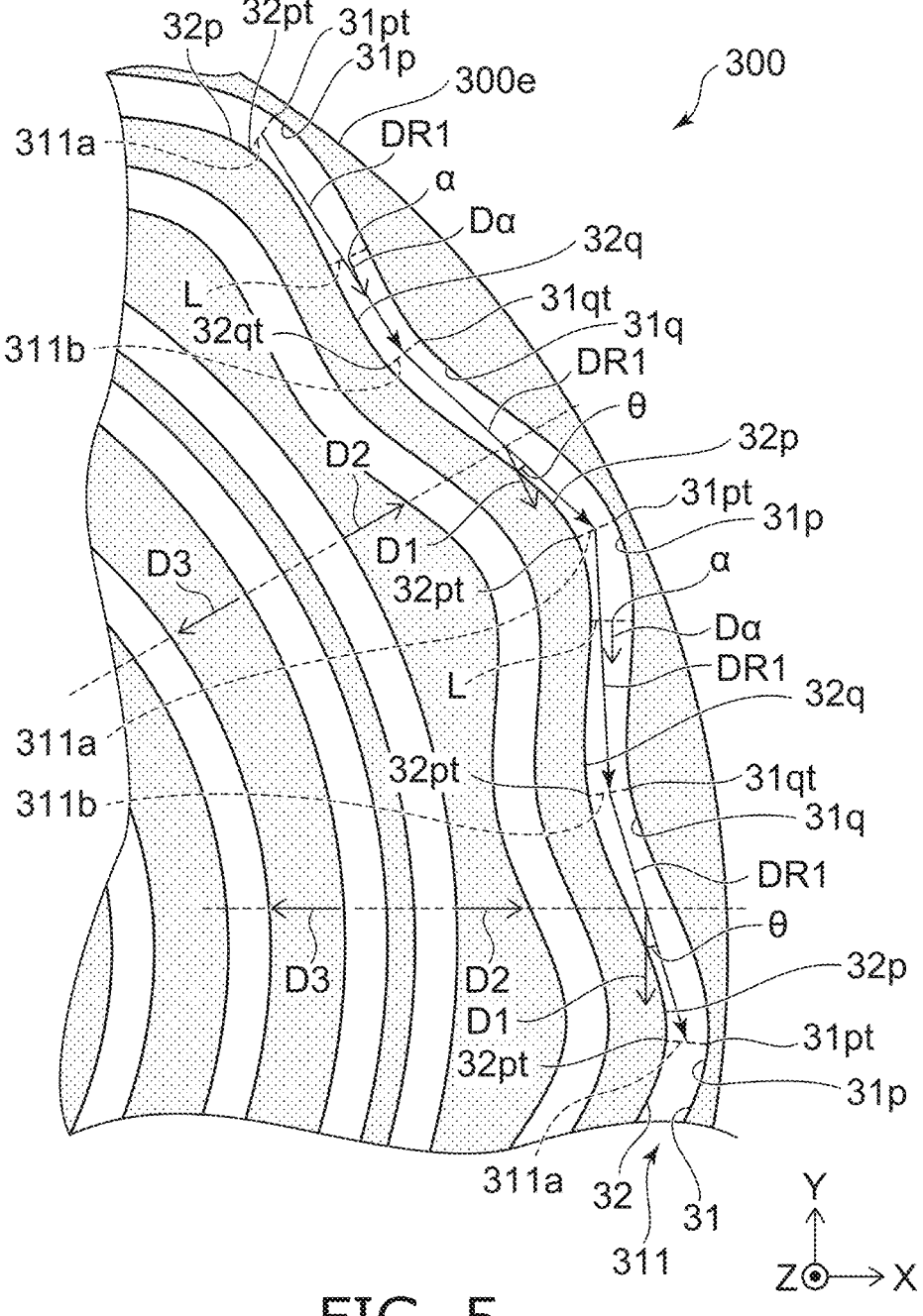
FIG. 5 is a cross-sectional view schematically illustrating a portion of the electrostatic chuck according to the embodiment.

FIG. 5 is a cross-sectional view schematically illustrating a portion of the electrostatic chuck according to the embodiment.

FIG. 5 illustrates an enlarged portion of FIG. 4. Each convex portion 31*p* includes a top portion 31*pt* (e.g., an apex). The top portion 31*pt* is the most protruding portion of one convex portion 31*p* in the second direction D2 when viewed from a position (e.g., the center 300*c* of the base plate 300) separated from the convex portion 31*p* in the direction D3. For example, the top portion 31*pt* is the outermost portion in the base plate 300 of the convex portion 31*p*. For example, the distance between the first side surface 31 and the center 300*c* is a maximum at the top portion 31*pt*. For example, the distance between the first side surface 31 and an outer circumference 300*e* of the base plate 300 is a minimum at the top portion 31*pt*.

Each concave portion 31*q* includes a top portion 31*qt* (e.g., an apex). The top portion 31*qt* is the most recessed portion of one concave portion 31*q* in the direction D3 when viewed from a position (e.g., the center 300*c* of the base plate 300) separated from the concave portion 31*q* in the direction D3. For example, the distance between the first side surface 31 and the center 300*c* is a minimum at the top portion 31*qt*. For example, the top portion 31*qt* is the innermost portion of the concave portion 31*q* in the base plate 300. For example, the distance between the first side surface 31 and the outer circumference 300*e* of the base plate 300 is a maximum at the top portion 31*qt*.

Each convex portion 32*p* includes a top portion 32*pt* (e.g., an apex). The top portion 32*pt* is the most protruding portion of one convex portion 32*p* in the second direction D2 when viewed from a position (e.g., the center 300*c* of the base plate 300) separated from the convex portion 32*p* in the direction D3. For example, the top portion 32*pt* is the outermost portion of the convex portion 32*p* in the base plate 300. For example, the distance between the second side surface 32 and the center 300*c* is a maximum at the top portion 32*pt*. For example, the distance between the second side surface 32 and the outer circumference 300*e* of the base plate 300 is a minimum at the top portion 32*pt*.

The concave portions 32*q* include a top portion 32*qt* (e.g., the apex). The top portion 32*qt* is the most recessed portion of one concave portion 32*q* in the direction D3 when viewed from a position (e.g., the center 300*c* of the base plate 300) separated from the concave portion 32*q* in the direction D3. For example, the top portion 32*qt* is the innermost portion of the concave portion 32*q* in the base plate 300. For example, the distance between the second side surface 32 and the center 300*c* is a minimum at the top portion 32*qt*. For example, the distance between the second side surface 32 and the outer circumference 300*e* of the base plate 300 is a maximum at the top portion 32*qt*. Instead of apexes, the top portions described above may be sides or surfaces.

As illustrated in FIG. 5, the first flow path part 311 includes a first portion 311*a* formed of the top portion 31*pt* and a second portion 311*b* formed of the top portion 31*qt*.

The first portion 311*a* is the range between the top portion 31*pt* and the position of the second side surface 32 most proximate to the top portion 31*pt* when viewed in plan. That is, each first portion 311*a* is a region between the top portion 31*pt* and the position of the second side surface 32 most proximate to the top portion 31*pt* when viewed in plan.

The second portion 311*b* is the range between the top portion 31*qt* and the position of the second side surface 32 most proximate to the top portion 31*qt* when viewed in plan. That is, each second portion 311*b* is the region between the top portion 31*qt* and the position of the second side surface 32 most proximate to the top portion 31*qt* when viewed in plan.

The first portion 311*a* and the second portion 311*b* are alternately arranged along the path of the coolant.

For example, in the range between the most proximate first portions 311*a* of the first flow path part 311 along the path of the coolant, a direction D31*p* that connects the top portions 31*pt* positioned at the two ends of the range (see FIG. 4) is along the first direction D1 at points within the range.

For example, in the range between the most proximate second portions 311*b* of the first flow path part 311 along the path of the coolant, a direction D31*q* that connects the top portions 31*qt* positioned at the two ends of the range (see FIG. 4) is along the first direction D1 at points within the range.

For example, a direction DR1 in which the coolant flows through the first flow path part 311 (which may be called the "first coolant direction DR1" below) is along the first direction D1. In the example, the first coolant direction DR1 may change along the path of the coolant because the communicating path 301 is curved and the first side surface 31 and the second side surface 32 meander. In such a case, for example, the first coolant direction DR1 at any location in the first flow path part 311 is along the first direction D1 at the location (in the example, the circumferential direction at the location).

For example, as illustrated in FIG. 5, in the range of the first flow path part 311 between the first portion 311*a* and the second portion 311*b* adjacent to each other along the path of the coolant, the first coolant direction DR1 can be set to be the direction connecting the center of the first portion 311*a* positioned at one end of the range and the center of the second portion 311*b* positioned at the other end of the range.

Two directions being "along" each other includes not only when the two directions are parallel but also may include when the angle between the two directions (the smallest angle between the two directions) is in the range of not more than 50° or not more than 25°. For example, as illustrated in FIG. 5, an angle θ between the first direction D1 (the circumferential direction) and the first coolant direction DR1 is not more than 50° or not more than 25° at any point of the first flow path part 311.

A direction Dα illustrated in FIG. 5 may be used as the first coolant direction DR1 at any point α inside the communicating path 301. The direction Dα is a direction perpendicular to a shortest line segment L connecting the first side surface 31 and the second side surface 32 when viewed in plan. The line segment L passes through the point α.

Or, in the range of the first flow path part 311 between the first portions 311*a* adjacent to each other along the path of the coolant, the direction D31*p* that connects the top portions 31*pt* positioned at the two ends of the range to each other (see FIG. 4) may be used as the first coolant direction DR1.

Or, in the range of the first flow path part 311 between the second portions 311*b* adjacent to each other along the path of the coolant, the direction D31*q* that connects the top portions 31*qt* positioned at the two ends of the range to each other (see FIG. 4) may be used as the first coolant direction DR1.

In the example, the width of the first flow path part 311 is constant. For example, the convex portion 31*p* (the top portion 31*pt*) is arranged with the convex portion 32*p* (the top portion 32*pt*) in the second direction D2. For example, the concave portion 31*q* (the top portion 31*qt*) is arranged with the concave portion 32*q* (the top portion 32*qt*) in the second direction D2. However, according to the embodiment, the width of the first flow path part 311 may not be constant and may change along the path of the coolant. The convex portion 31*p* (the top portion 31*pt*) may be arranged with the concave portion 32*q* (the top portion 32*qt*) in the second direction D2 instead of being arranged with the convex portion 32*p* (the top portion 32*pt*) in the second direction D2. The concave portion 31*q* (the top portion 31*qt*) may be arranged with the convex portion 32*p* (the top portion 32*pt*) in the second direction D2 instead of being arranged with the concave portion 32*q* (the top portion 32*qt*) in the second direction D2.

FIG. 6 is a cross-sectional view schematically illustrating a portion of the electrostatic chuck according to the embodiment.

FIG. 6 illustrates an enlarged portion of FIG. 4. The multiple convex portions 31*p* include a first convex portion 31*pa* that is one of the convex portions 31*p*. The multiple concave portions 31*q* include a first concave portion 31*qa* that is one of the concave portions 31*q*. The first concave portion 31*qa* is adjacent to the first convex portion 31*pa* and continuous with the first convex portion 31*pa*. That is, the first concave portion 31*qa* is arranged with the first convex portion 31*pa* in the first direction D1 and is the concave portion among the multiple concave portions 31*q* most proximate to the first convex portion 31*pa*.

A distance L1 (a first distance) illustrated in FIG. 6 is greater than a distance La. The distance La is the shortest distance between one side surface (the first side surface 31) and the other side surface (the second side surface 32) of the first flow path part 311. That is, the distance La is the width of the narrowest portion of the first flow path part 311 when viewed in plan. In the example as described above, the width of the first flow path part 311 is constant.

The distance L1 corresponds to the distance along the second direction D2 (the second direction D2 at the top portion 31*pt* or the top portion 31*qt*) between the top portion 31*pt* of the first convex portion 31*pa* and the top portion 31*qt* of the first concave portion 31*qa*. For example, the distance L1 corresponds to a length of two times the amplitude of the meandering of the first side surface 31.

More specifically, the distance L1 is the distance (the shortest distance) between a first virtual circle IC1 and a second virtual circle IC2 illustrated in FIG. 6. The first virtual circle IC1 is centered on the center 300*c* of the base plate 300 and contacts the first convex portion 31*pa* (the top portion 31*pt* of the first convex portion 31*pa*). The second virtual circle IC2 is centered on the center 300*c* of the base plate 300 and contacts the first concave portion 31*qa* (the top portion 31*qt* of the first concave portion 31*qa*). The distance L1 is, for example, not less than 5 millimeters (mm) and not more than 30 mm, and favorably not less than 10 mm and not more than 15 mm. For example, the amplitude (half of the distance L1) may be equal to or less than the distance La.

It is favorable for the distance L1 to be not less than 2 times and not more than 3 times the distance La. For example, when the distance La is 3 mm, it is favorable for the distance L1 to be not less than 6 mm and not more than 9 mm; and when the distance La is 7 mm, it is favorable for the distance L1 to be not less than 14 mm and not more than 21 mm.

A distance L2 (a second distance) illustrated in FIG. 6 is, for example, not less than 30 mm and not more than 140 mm, and favorably not less than 50 mm and not more than 80 mm. The distance L2 corresponds to the distance along the first direction D1 between the top portion 31*pt* of the first convex portion 31*pa* and the top portion 31*qt* of the first concave portion 31*qa*. For example, the distance L2 corresponds to the length of half of the meandering period of the first side surface 31.

It is favorable for the distance L2 to be not less than 10 times and not more than 20 times the distance La. For example, when the distance La is 3 mm, it is favorable for the distance L2 to be not less than 30 mm and not more than 60 mm; and when the distance La is 7 mm, it is favorable for the distance L2 to be not less than 70 mm and not more than 140 mm.

More specifically, the distance L2 is the distance along the first direction D1 (the circumferential direction) between a point p1 and a point p2 illustrated in FIG. 6.

The point p1 is the intersection between a third virtual circle IC3 and a first radial line R1. The point p2 is the intersection between the third virtual circle IC3 and a second radial line R2. The third virtual circle IC3 is centered on the center 300*c* of the base plate 300 and positioned between the first virtual circle IC1 and the second virtual circle IC2. The distance (the shortest distance) between the first virtual circle IC1 and the third virtual circle IC3 is equal to the distance (the shortest distance) between the second virtual circle IC2 and the third virtual circle IC3. The first radial line R1 is a straight line passing through the center 300*c* of the base plate 300 and the first convex portion 31*pa* (the top portion 31*pt* of the first convex portion 31*pa*). The second radial line R2 is a straight line passing through the center 300*c* of the base plate 300 and the first concave portion 31*qa* (the top portion 31*qt* of the first concave portion 31*qa*).

A description similar to the description related to the shapes of the concave portion and the convex portion provided in the first side surface 31 is applicable to the shapes of the concave portion and the convex portion provided in the second side surface 32.

FIGS. 7A to 7F are schematic cross-sectional views illustrating examples of a method for manufacturing the electrostatic chuck according to the embodiment.

Figures 7A, 7B, 7C, 7D, 7E, 7F:
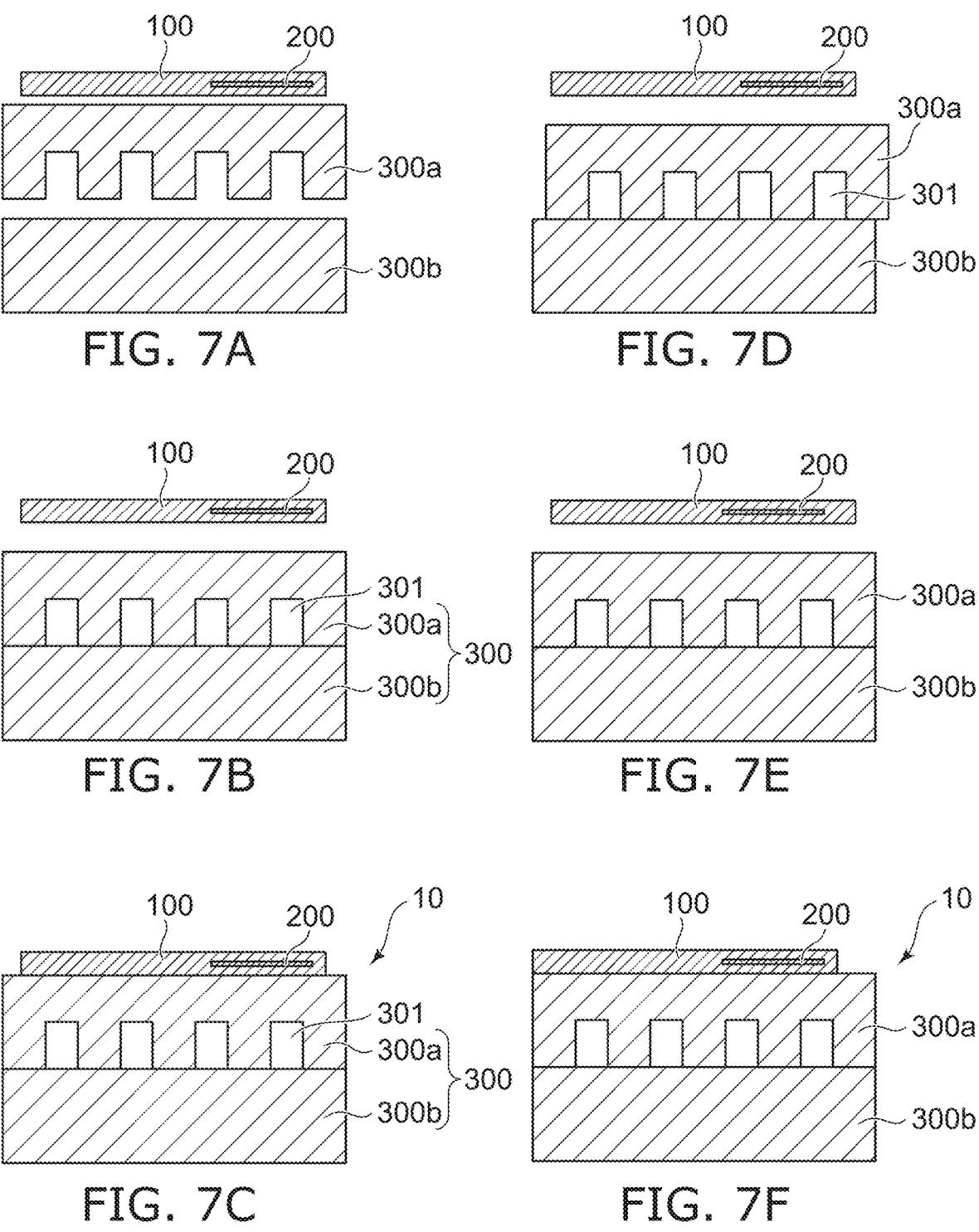
FIGS. 7A to 7F are schematic cross-sectional views illustrating examples of a method for manufacturing the electrostatic chuck according to the embodiment.

In the manufacturing processes of the electrostatic chuck, there are cases where the position of a communicating path 301 (a coolant flow path) provided in the base plate 300 deviates from the design. FIGS. 7A to 7C illustrate a case where the position of the communicating path 301 does not deviate from the design. FIGS. 7D to 7F illustrate an example in which the position of the communicating path 301 deviates from the design.

As illustrated in FIG. 7A, the upper material 300*a* is bonded on the lower material 300*b*. As illustrated in FIG. 7B, the base plate 300 is formed thereby. The ceramic dielectric substrate 100 is bonded on the base plate 300. As illustrated in FIG. 7C, the electrostatic chuck 10 is manufactured thereby. In the example, the heater unit 200 is embedded in the ceramic dielectric substrate 100; and the electrode 111 is not illustrated.

For example, as illustrated in FIG. 7D, there are cases where the relative position of the upper material 300*a* and the lower material 300*b* deviates from the design when bonding between the upper material 300*a* and the lower material 300*b*. Accordingly, there are cases where the relative position of the communicating path 301 with respect to the placement surface of the ceramic dielectric substrate 100 (and the process object placed on the placement surface) and/or the heater unit 200 deviates from the design.

For example, as illustrated in FIG. 7E, there are cases where the relative position between the ceramic dielectric substrate 100 and the heater unit 200 deviates from the design in the manufacturing processes of the ceramic dielectric substrate 100 and the heater unit 200. Accordingly, there are cases where the relative position of the communicating path 301 with respect to the heater unit 200 deviates from the design.

For example, as illustrated in FIG. 7F, there are cases where the relative position of the ceramic dielectric substrate 100 and the base plate 300 deviates from the design when bonding between the ceramic dielectric substrate 100 and the base plate 300. Accordingly, there are cases where the relative position of the communicating path 301 with respect to the placement surface of the ceramic dielectric substrate 100 (and the process object placed on the placement surface) and/or the heater unit 200 deviates from the design.

In the electrostatic chuck 10 as described above, the communicating path 301 is provided in the base plate 300 to cool the wafer or the like that is the object to be held. For example, the coolant suppresses overheating of the wafer due to the heat input from the plasma in the processing. In the electrostatic chuck 10 that includes the heater unit 200, the temperature of the surface on which the process object is placed is controlled by heating by the heater unit 200 and by cooling by the coolant. Also, cooling gas introduction holes and/or grooves are provided in the ceramic dielectric substrate; and the temperature control of the object to be held is performed using helium gas, etc. The positional relationship between the communicating path and the arrangement of such cooling gas introduction holes grooves, etc., is appropriately designed to make the temperature distribution in the surface on which the process object is placed as uniform as possible.

For example, the electrostatic chuck 10 is formed by bonding the base plate and the ceramic substrate with a bonding layer. There are also cases where the base plate is formed by bonding multiple members. There are cases where the position of the communicating path 301 with respect to the ceramic dielectric substrate 100 deviates from the design in the manufacturing processes of the electrostatic chuck 10. When the position of the communicating path 301 deviates, there is a risk of a discrepancy in which the temperature distribution in the surface on which the process object of the ceramic dielectric substrate 100 is placed deviates from the design.

In contrast, in the electrostatic chuck according to the embodiment, multiple convex portions and multiple concave portions are alternately arranged in at least one side surface of the first flow path part 311 of the communicating path 301. Therefore, the deviation from the design of the temperature distribution in the placement surface of the ceramic dielectric substrate can be suppressed to be small when the position of the communicating path deviates from the design.

FIGS. 8A to 8D and FIGS. 9A to 9F are schematic views illustrating a simulation of the temperature distribution of the electrostatic chuck.

Figures 8A, 8B, 8C, 8D:
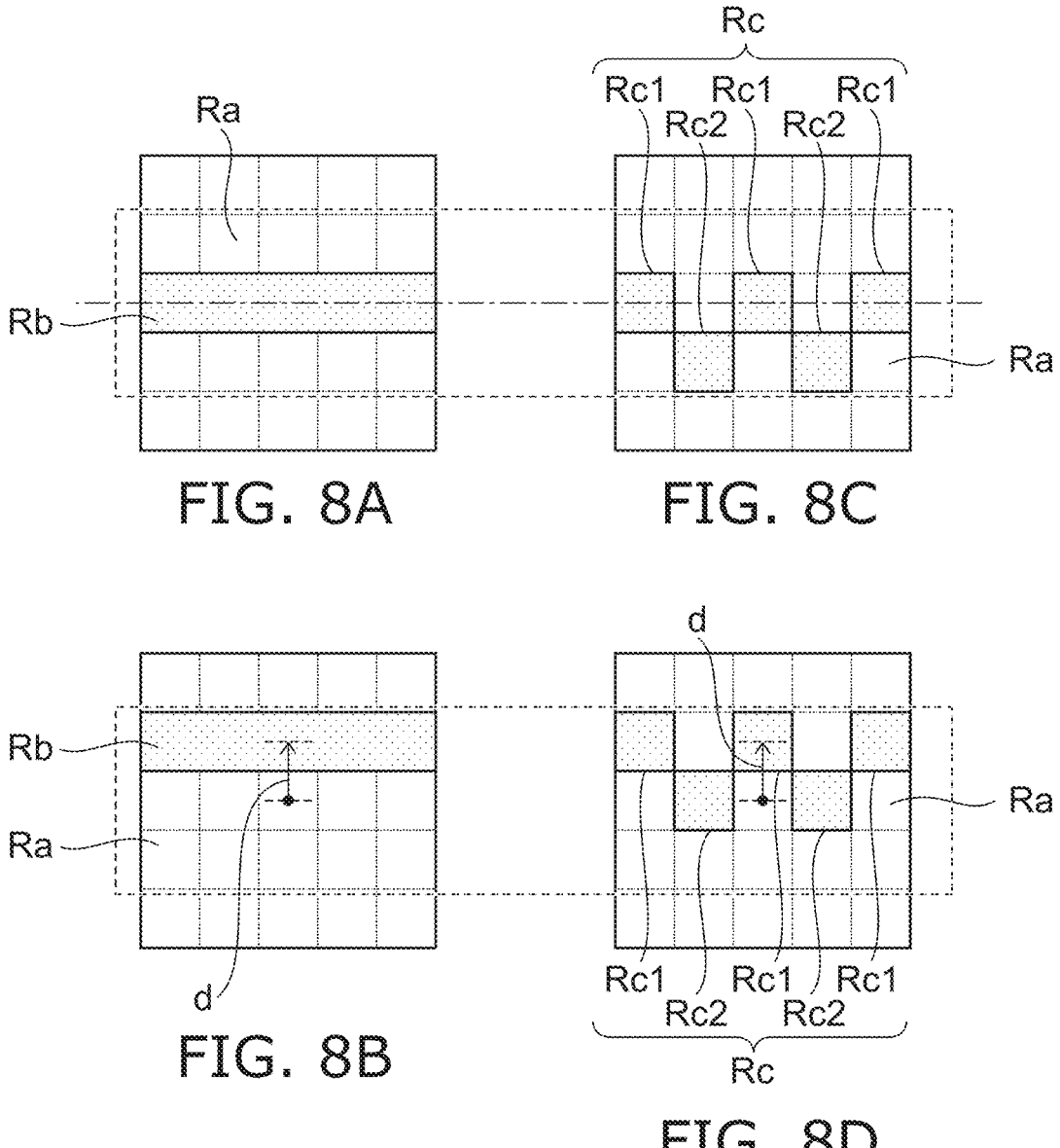
FIGS. 8A to 8D are schematic views illustrating a simulation of the temperature distribution of the electrostatic chuck.

FIGS. 8A to 8D illustrate models of the electrostatic chuck used in the simulation. FIGS. 8A and 8B correspond to perspective views of an electrostatic chuck according to a reference example when viewed from above. A region Ra in FIGS. 8A and 8B corresponds to the placement surface of the ceramic dielectric substrate; and a region Rb corresponds to the communicating path (the coolant flow path) positioned below the region Ra. In the electrostatic chuck according to the reference example, an unevenness is not provided in the region Rb (the communicating path). FIG. 8B illustrates a state in which the position of the region Rb with respect to the region Ra is shifted by the amount of a distance d in the direction of the arrow from the state of FIG. 8A.

FIGS. 8C and 8D correspond to perspective views of the electrostatic chuck according to the embodiment when viewed from above. In FIGS. 8C and 8D, the region Ra corresponds to the placement surface of the ceramic dielectric substrate; and a region Rc corresponds to the communicating path (the coolant flow path) positioned below the region Ra. In the electrostatic chuck according to the embodiment, an unevenness is provided in the region Rc (the communicating path). That is, the region Rc includes multiple portions Rc1 and multiple portions Rc2. For example, the portion Rc1 corresponds to the convex portion 31p; and the portion Rc2 corresponds to the concave portion 31q. FIG. 8D illustrates a state in which the position of the region Rc with respect to the region Ra is shifted by the amount of the distance d in the direction of the arrow from the state of FIG. 8C. The shift amount (the distance d) is the same in FIGS. 8B and 8D.

Figures 9A, 9B, 9C, 9D, 9E, 9F:
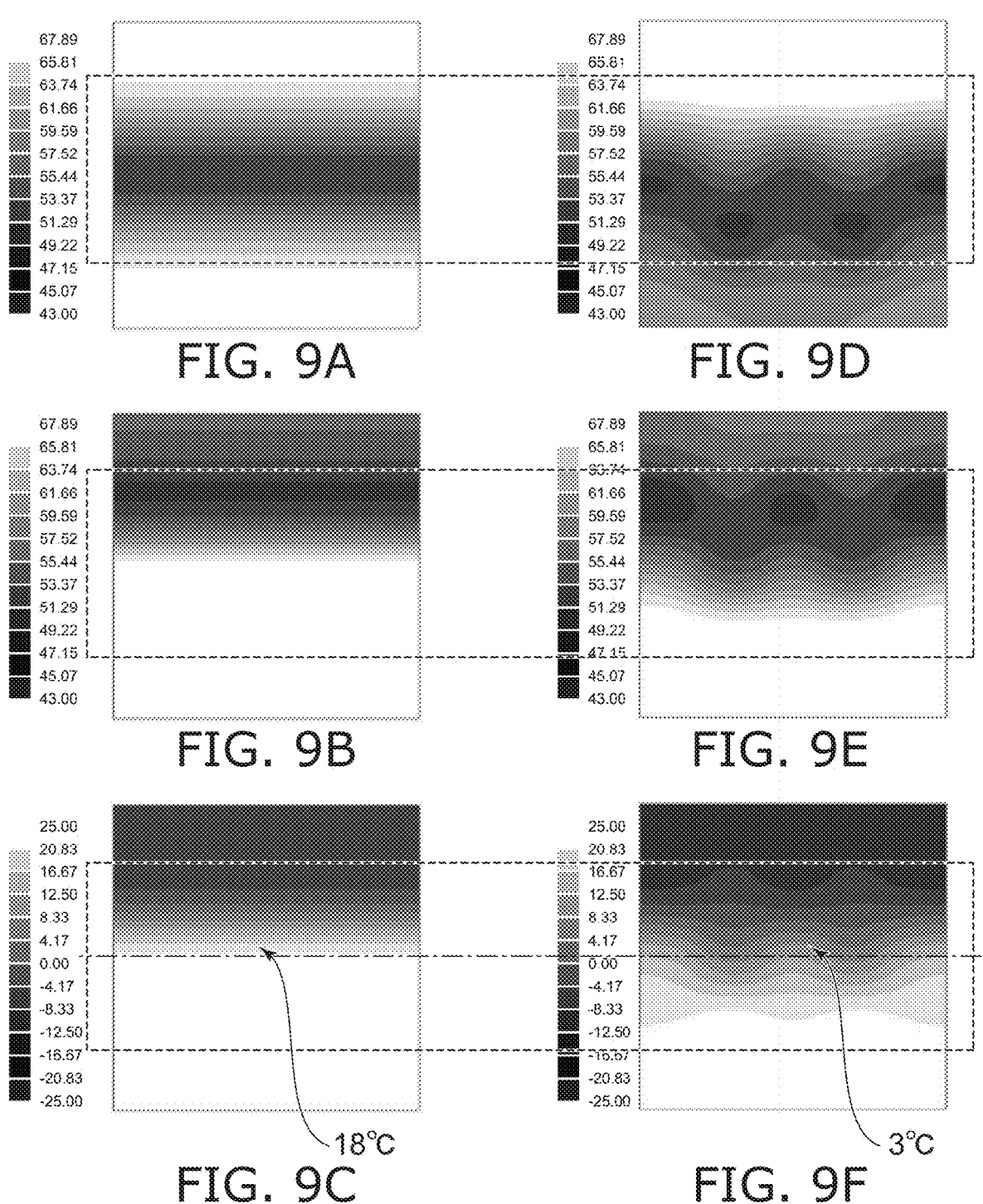
FIGS. 9A to 9F are schematic views illustrating a simulation of the temperature distribution of the electrostatic chuck.

FIGS. 9A to 9C correspond to the temperature distribution of the placement surface of the ceramic dielectric substrate in the electrostatic chuck according to the reference example. FIG. 9A corresponds to the temperature distribution of the model illustrated in FIG. 8A when the entirety is heated while cooling the region Rb at a prescribed heat amount. FIG. 9B corresponds to the temperature distribution of the model illustrated in FIG. 8B when the entirety is heated while cooling the region Rb at a prescribed heat amount. FIG. 9C illustrates the value of the temperature of FIG. 9A subtracted from the temperature of FIG. 9B. That is, FIG. 9C illustrates the effects on the temperature distribution due to the misalignment of the region Rb.

Similarly, FIGS. 9D to 9F correspond to the temperature distribution of the placement surface of the ceramic dielectric substrate in the electrostatic chuck according to the embodiment. FIG. 9D corresponds to the temperature distribution of the model illustrated in FIG. 8C when the entirety is heated while cooling the region Rc at a prescribed heat amount. FIG. 9E corresponds to the temperature distribution of the model illustrated in FIG. 8D when the entirety is heated while cooling the region Rc at a prescribed heat amount. FIG. 9F illustrates the value of the temperature of FIG. 9E subtracted from the temperature of FIG. 9D. That is, FIG. 9F illustrates the effects on the temperature distribution due to the misalignment of the region Rc.

At the vicinity of the position of the arrow illustrated in FIG. 9C, the temperature changed 18° C. due to the misalignment of the region Rb. In contrast, at the vicinity of the position of the arrow illustrated in FIG. 9F, the temperature changed 3° C. due to the misalignment of the region Rc. Also, the change of the temperature in FIG. 9F is smoother than the temperature change in FIG. 9C. By providing the unevenness in the communicating path, the temperature change of the placement surface due to the misalignment of the communicating path can be reduced. In other words, for example, by adding an unevenness to the side surface of the communicating path extending in the first direction D1, the robustness of the temperature distribution to the misalignment of the communicating path is improved.

In the example as described above, multiple convex portions and multiple concave portions also are provided in the other side surface of the pair of side surfaces (the first side surface 31 and the second side surface 32); and these multiple convex portions and multiple concave portions are alternately arranged. That is, multiple convex portions and multiple concave portions are alternately arranged in both side surfaces of the communicating path 301. The deviation from the design of the temperature distribution in the placement surface accompanying the misalignment of the communicating path 301 can be further suppressed thereby.

However, according to the embodiment, it is sufficient for the concave portion and the convex portion to be provided in at least one of the pair of side surfaces (the first side surface 31 and the second side surface 32). The first side surface 31 may include the convex portion and the concave portion; and the second side surface 32 may extend in the first direction D1 without including the convex portion and the concave portion. For example, one side surface (the first side surface 31) of the pair of side surfaces that includes the multiple concave portions and the multiple convex portions is positioned radially outward of the other side surface (the second side surface 32) in the base plate 300. When the first flow path part 311 of the communicating path 301 extends along the circumferential direction of the base plate 300, and when the position of the first flow path part 311 deviates from the design, the effects on the temperature distribution due to the misalignment may be greater outward of the first flow path part 311 than inward of the first flow path part 311. In contrast, the multiple convex portions and the multiple concave portions are provided in the side surface at the outer side (the first side surface 31). The deviation from the design of the temperature distribution in the placement surface outward of the first flow path part 311 can be further suppressed thereby. However, the second side surface 32 may include the convex portion and the concave portion; and the first side surface 31 may extend in the first direction D1 without including the convex portion and the concave portion.

In the example, the first direction D1 is the circumferential direction of the base plate 300. Accordingly, for example, the first flow path part 311 extends along the exterior shapes of the base plate 300 and the process object W. For example, the effects on the temperature distribution due to the misalignment at the outer circumference are easily suppressed thereby.

As described with reference to FIG. 6, the distance L1 is greater than the distance La. The distance L1 is, for example, not less than 5 mm. Thus, by setting the first distance L1 (e.g., the meandering amount of the side surface of the communicating path) to be long, the deviation from the design of the temperature distribution in the placement surface can be suppressed even when the misalignment of the communicating path when manufacturing the electrostatic chuck is slightly large.

As described with reference to FIG. 6, the second distance L2 is not less than 30 mm and not more than 140 mm. The deviation from the design of the temperature distribution in the placement surface accompanying the misalignment of the communicating path can be further suppressed because the second distance L2 (e.g., half of the meandering period of the side surface of the communicating path) is less than a prescribed value.

The terms "amplitude" and "period" are used for convenience in the description of the embodiment. However, according to the embodiment, the first distance L1 and the second distance L2 are not necessarily constant over the entire circumference. In other words, the concave portion and the convex portion may not always be repeated at a constant spacing.

Figure 10:
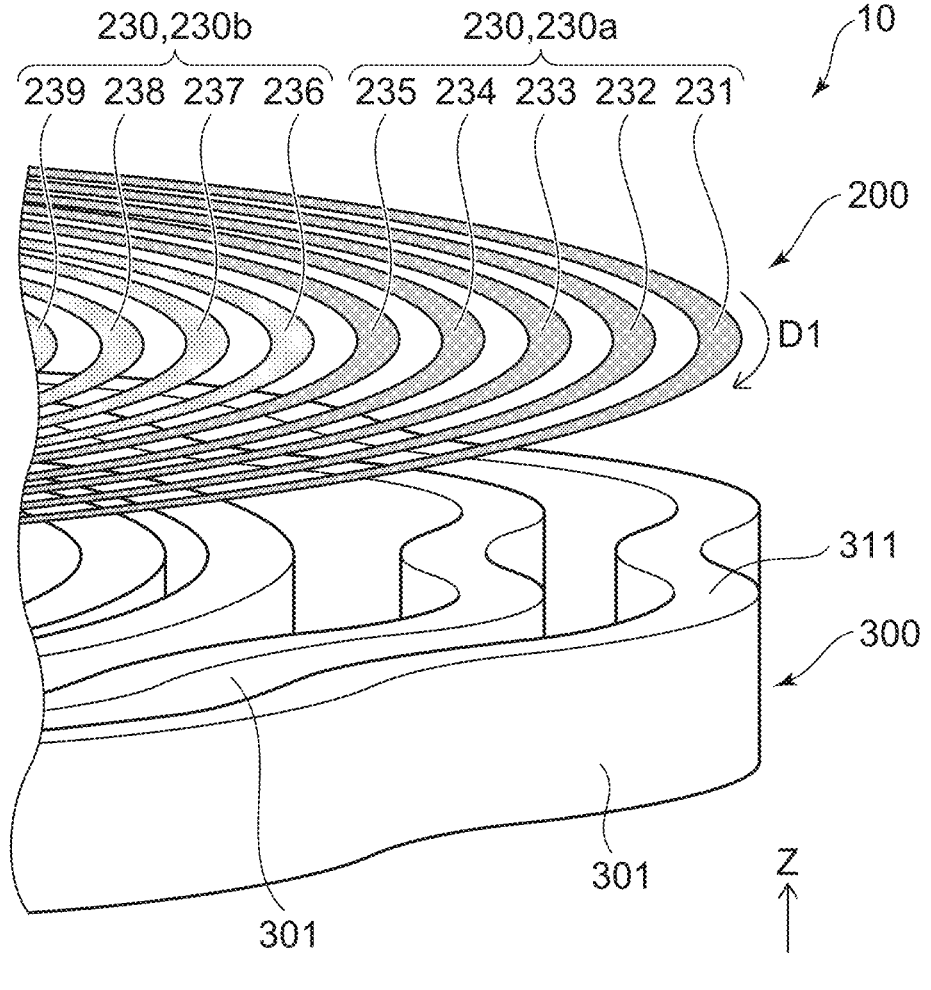
FIG. 10 is a perspective view schematically illustrating a portion of the electrostatic chuck according to the embodiment.

FIG. 10 is a perspective view schematically illustrating a portion of the electrostatic chuck according to the embodiment.

FIG. 10 illustrates a portion of the heater unit 200 and a portion of the communicating path 301.

The heater unit 200 includes a heater element 230 positioned above the communicating path 301. The heater element 230 includes band-shaped electrically-conductive parts extending along the X-Y plane. For example, the heater element 230 is electrically connected to an external power supply (not illustrated). A current that flows from one end to the other end of the heater element 230 is supplied to the heater element 230 from the outside. Accordingly, the heater element 230 (the heater line) generates heat. By controlling the current flowing in the heater element 230, the generated heat amount of the heater element 230 can be controlled, and the temperature of the placement surface of the ceramic dielectric substrate 100 can be controlled.

Multiple heater elements 230 may be included. The multiple heater elements 230 may be arranged in the X-Y plane. The multiple heater elements 230 may be stacked in the Z-direction with an insulating film interposed. By providing multiple heater elements 230, the temperatures of the placement surface and the process object are more easily controlled. For example, the uniformity of the in-plane temperature distribution of the process object on which the placement surface is placed can be increased.

For example, metals including at least one of stainless steel, titanium, chrome, nickel, copper, aluminum, Inconel (registered trademark), nickel, molybdenum, tungsten, palladium, platinum, silver, tantalum, molybdenum carbide, or tungsten carbide, etc., are examples of the material of the heater element 230. The thickness (the Z-direction length) of the heater element 230 is, for example, not less than about 0.01 mm and not more than about 0.20 mm.

In the example illustrated in FIG. 10, the heater element 230 includes a first heater element 230a and a second heater element 230b. The first heater element 230a includes first to fifth heater lines 231 to 235. The first to fifth heater lines 231 to 235 may be electrically connected to each other or may be insulated from each other. The second heater element 230b includes sixth to ninth heater lines 236 to 239. The sixth to ninth heater lines 236 to 239 may be electrically connected to each other or may be insulated from each other.

For example, the first to ninth heater lines 231 to 239 each have circular arc shapes extending along the first direction D1 (the circumferential direction). The first to ninth heater lines 231 to 239 are arranged in this order from the outer circumference when viewed in plan. That is, the first heater line 231 is the portion of the multiple heater elements 230 positioned at the outermost circumference. The shape of the heater element 230 may not always extend along the circumferential direction and may not be a circular arc shape.

Figures 11A, 11B:
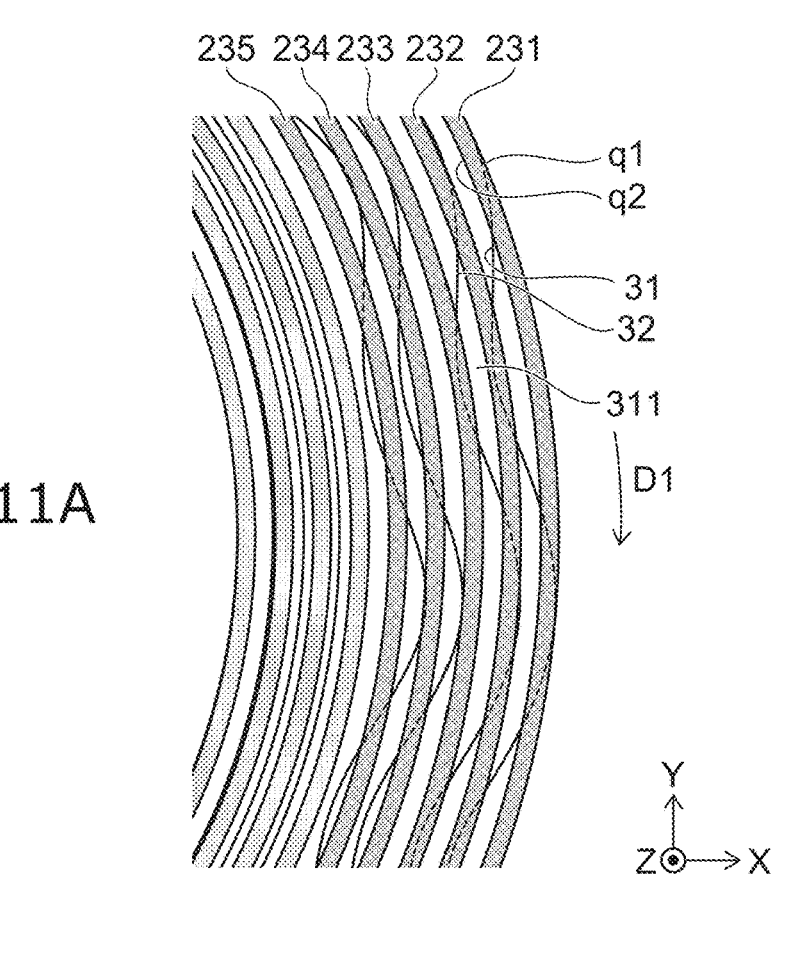
FIGS. 11A and 11B are perspective plan views schematically illustrating portions of the electrostatic chuck according to the embodiment.

FIGS. 11A and 11B are perspective plan views schematically illustrating portions of the electrostatic chuck according to the embodiment.

FIGS. 11A and 11B each correspond to states in which the heater element 230 and the communicating path 301 shown in FIG. 10 are viewed from above. FIG. 11A illustrates a case where the relative position of the communicating path 301 with respect to the heater unit 200 does not deviate from the design. FIG. 11B illustrates a case where the relative position of the communicating path 301 with respect to the heater unit 200 deviates from the design.

The first heater line 231 includes a first side q1 and a second side q2 extending along the extension direction of the first heater line 231 (in the example, the circumferential direction) when viewed in plan. The first side q1 is arranged with the second side q2 in the radial direction (the second direction D2). The first side q1 is positioned outward of the second side q2 in the base plate 300. Similarly, the second to ninth heater lines 232 to 239 each include a pair of sides (the first side q1 and the second side q2).

As illustrated in FIGS. 11A and 11B, at least one of the pair of sides of the first heater line 231 overlaps the first flow path part 311 in the Z-direction. When the position of the communicating path 301 cooling the placement surface deviates from the design with respect to the heater unit 200 heating the placement surface, the deviation from the design of the temperature distribution in the placement surface is likely to increase. In contrast, according to the embodiment, at least a portion of one side of the heater line overlaps the first flow path part 311 of the communicating path 301; therefore, the deviation from the design of the temperature distribution in the placement surface can be further suppressed when the position of the communicating path 301 with respect to the heater unit 200 deviates from the design.

For example, the first side q1 of the first heater line 231 overlaps the first side surface 31 in the Z-direction. The second side q2 of the first heater line 231 overlaps the second side surface 32 in the Z-direction. For example, the extension direction of the first heater line 231 is the same as the first direction D1. In such a case, the multiple concave portions 31q and the multiple convex portions 31p of the first flow path part 311 are alternately arranged along the extension direction of the first heater line. Accordingly, the deviation from the design of the temperature distribution in the placement surface can be further suppressed when the position of the communicating path 301 with respect to the heater unit 200 deviates from the design.

For example, the first flow path part 311 may overlap multiple heater lines when viewed in plan. In the example of FIGS. 11A and 11B, the first flow path part 311 overlaps the first and second heater lines 231 and 232 in the Z-direction. The first flow path part 311 may overlap only one heater line in the Z-direction, or may overlap three or more heater lines.

Figure 12:
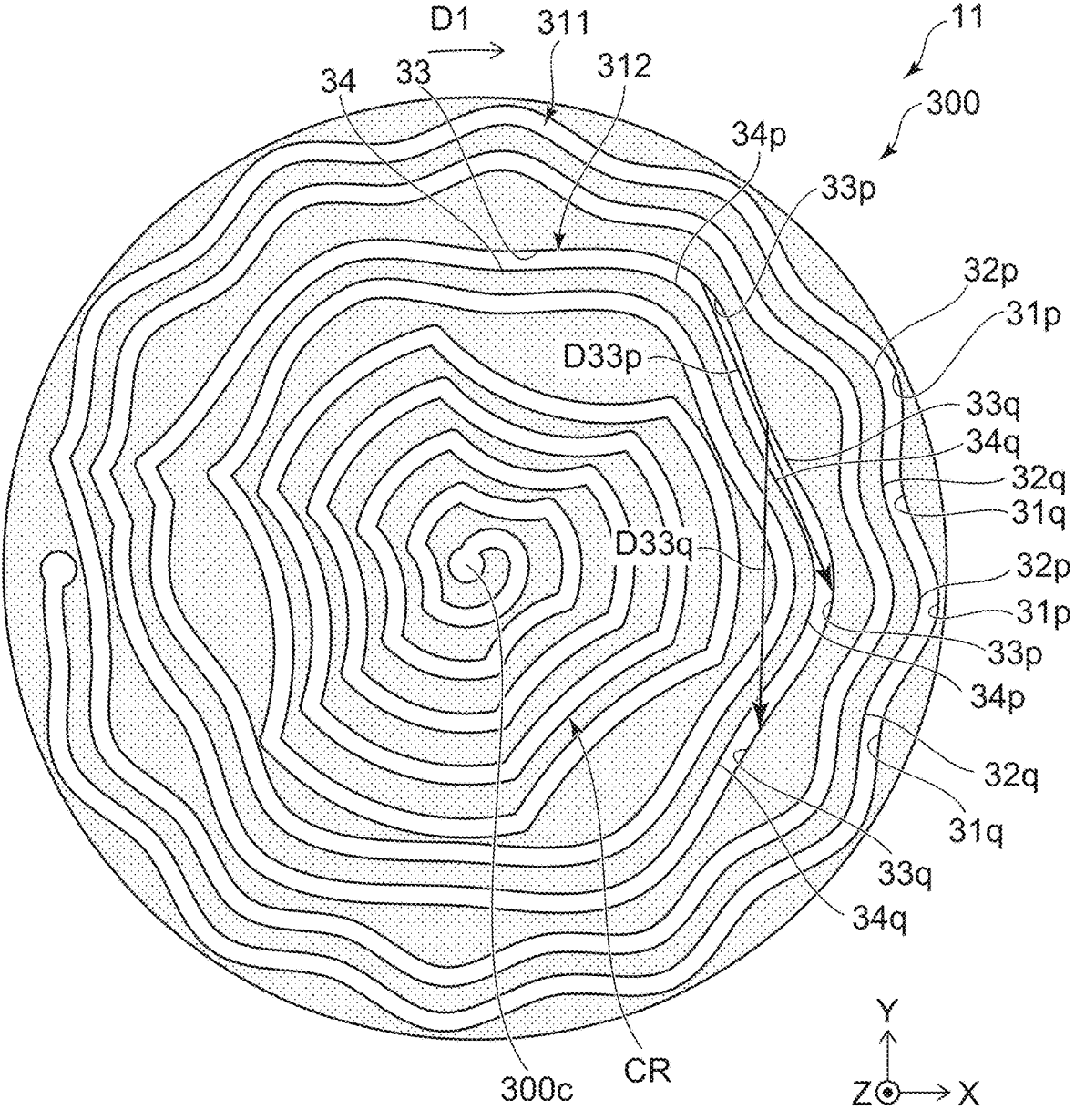
FIG. 12 is a cross-sectional view schematically illustrating a portion of another electrostatic chuck according to the embodiment.

FIG. 12 is a cross-sectional view schematically illustrating a portion of another electrostatic chuck according to the embodiment.

Similarly to FIG. 4, FIG. 12 illustrates a cross section of a portion of the electrostatic chuck 11 according to the embodiment, and illustrates the planar shape of the base plate 300 and the communicating path 301 when viewed from above. The electrostatic chuck 11 includes, for example, the second flow path part 312 that extends along the first direction D1 while meandering. Otherwise, a description similar to that of the electrostatic chuck 10 is applicable to the electrostatic chuck 11.

The second flow path part 312 is positioned radially inward of the first flow path part 311 in the base plate 300. For example, the second flow path part 312 is positioned between the first flow path part 311 and the center 300c of the base plate 300. The second flow path part 312 may be located in the central region CR of the base plate 300. The second flow path part 312 is a portion of one spiral-shaped communicating path 301 and is connected to the first flow path part 311. The second flow path part 312 is provided so as to surround the center 300c. For example, the second flow path part 312 makes one turn around the center 300c and surrounds the entire circumference of the center 300c. However, the second flow path part 312 may have a circular arc shape (one portion of a spiral shape or an annular shape) and may surround the center 300c over one or more turns.

The second flow path part 312 includes a pair of side surfaces (inner wall surfaces) crossing the X-Y plane. For example, the pair of side surfaces extends along the first direction D1. Specifically, the second flow path part 312 has the third side surface 33 and the fourth side surface 34.

In the following description, the third side surface 33 is the outer side surface in the base plate 300; and the fourth side surface 34 is the inner side surface in the base plate 300. That is, the fourth side surface 34 is positioned between the third side surface 33 and the center 300c of the base plate 300. However, in the following description, the third side surface 33 may be the inner side surface in the base plate 300; and the fourth side surface 34 may be the outer side surface in the base plate 300.

The third side surface 33 and the fourth side surface 34 face each other and extend in the X-Y plane. The coolant flows between the third side surface 33 and the fourth side surface 34. For example, the third side surface 33 faces the fourth side surface 34 in the radial direction of the planar shape of the base plate 300.

When viewed along the Z-direction, one of the pair of side surfaces (the third side surface 33 and the fourth side surface 34) of the second flow path part 312 includes multiple convex portions and multiple concave portions. For example, the third side surface 33 includes multiple convex portions 33p and multiple concave portions 33q. The multiple convex portions 33p each are convex in the second direction D2. The multiple concave portions 33q each are convex in the direction D3 opposite to the second direction D2. In other words, for example, when viewed in plan, the convex portion 33p is outwardly convex in the base plate 300 (e.g., is convex in a direction from the center toward the outer edge of the base plate 300). For example, when viewed in plan, the concave portion 33q is inwardly convex in the base plate 300 (e.g., is convex in a direction from the outer edge toward the center of the base plate 300).

The multiple convex portions 33p and the multiple concave portions 33q are alternately arranged along the path through which the coolant flows through the communicating path 301. The multiple convex portions 33p and the multiple concave portions 33q are alternately arranged along the first direction D1.

In the example, both of the pair of side surfaces of the second flow path part 312 meander. That is, when viewed along the Z-direction, the other side surface of the pair of side surfaces (the third side surface 33 and the fourth side surface 34) of the second flow path part 312 includes multiple convex portions and multiple concave portions. In other words, the fourth side surface 34 includes multiple convex portions 34p and multiple concave portions 34q. The multiple convex portions 34p each are convex in the second direction D2. The multiple concave portions 34q each are convex in the direction D3 opposite to the second direction D2. In other words, for example, when viewed in plan, the convex portion 34p is outwardly convex in the base plate 300 (e.g., is convex in a direction from the center toward the outer edge of the base plate 300). For example, when viewed in plan, the concave portion 34q is inwardly convex in the base plate 300 (e.g., is convex in a direction from the outer edge toward the center of the base plate 300).

The multiple convex portions 34p and the multiple concave portions 34q are alternately arranged along the path through which the coolant flows through the communicating path 301. The multiple convex portions 34p and the multiple concave portions 34q are alternately arranged along the first direction D1.

The convex portion 33p, the concave portion 33q, the convex portion 34p, and the concave portion 34q each are curves (e.g., circular arcs) when viewed in plan. However, the convex portion 33p, the concave portion 33q, the convex portion 34p, and the concave portion 34q each may include linear portions at least partially. A portion that extends along the first direction D1 between the convex portion 33p and the concave portion 33q may be provided. A portion that extends along the first direction D1 between the convex portion 34p and the concave portion 34q may be provided.

Figure 13:
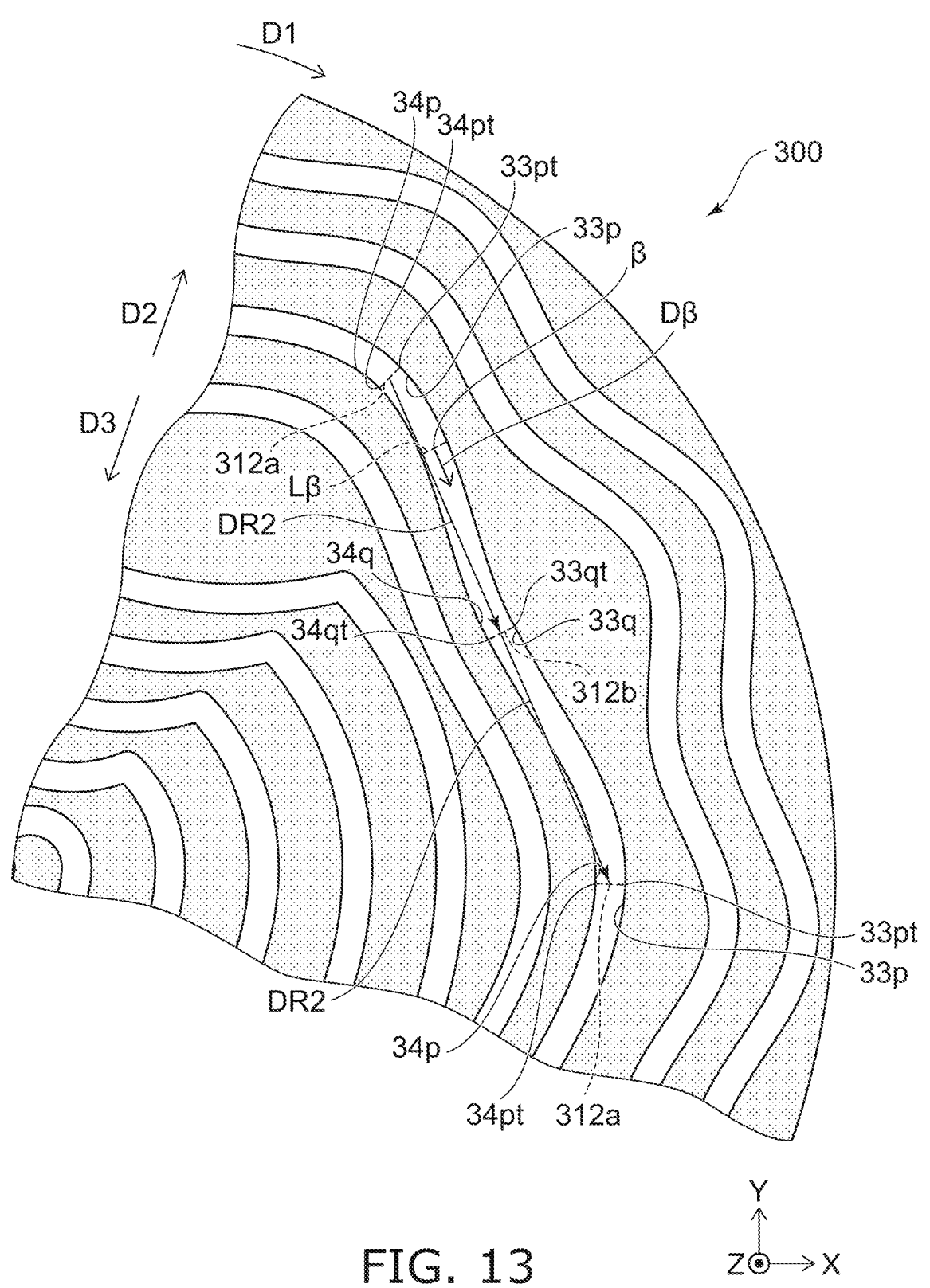
FIG. 13 is a cross-sectional view schematically illustrating a portion of the electrostatic chuck according to the embodiment.

FIG. 13 is a cross-sectional view schematically illustrating a portion of the electrostatic chuck according to the embodiment.

FIG. 13 illustrates an enlarged portion of FIG. 12. Each convex portion 33p includes a top portion 33pt (e.g., an apex). The top portion 33pt is the most protruding portion of one convex portion 33p in the second direction D2 when viewed from a position (e.g., the center 300c of the base plate 300) separated from the convex portion 33p in the direction D3. For example, the top portion 33pt is the outermost portion of the convex portion 33p in the base plate 300 (the portion furthest from the center 300c when viewed in plan).

Each concave portion 33q includes a top portion 33qt (e.g., an apex). The top portion 33qt is the most recessed portion of one concave portion 33q in the direction D3 when viewed from a position (e.g., the center 300c of the base plate 300) separated from the concave portion 33q in the direction D3. For example, the top portion 33qt is the innermost portion of the concave portion 33q in the base plate 300 (the portion most proximate to the center 300c when viewed in plan).

Each convex portion 34p includes a top portion 34pt (e.g., an apex). The top portion 34pt is the most protruding portion of one convex portion 34p in the second direction D2 when viewed from a position (e.g., the center 300c of the base plate 300) separated from the convex portion 34p in the direction D3. For example, the top portion 34pt is the outermost portion of the convex portion 34p in the base plate 300.

Each concave portion 34q includes a top portion 34qt (e.g., an apex). The top portion 34qt is the most recessed portion of one concave portion 34q in the direction D3 when viewed from a position (e.g., the center 300c of the base plate 300) separated from the concave portion 34q in the direction D3. For example, the top portion 34qt is the innermost portion of the concave portion 34q in the base plate 300. The top portions described above may be sides instead of apexes.

As illustrated in FIG. 13, the second flow path part 312 includes a third portion 312a formed of the top portion 33pt and a fourth portion 312b formed of the top portion 33qt.

The third portion 312a is the range between the top portion 33pt and the position of the fourth side surface 34 most proximate to the top portion 33pt when viewed in plan. That is, each third portion 312a is a region between the apex 33pt and the position of the fourth side surface 34 most proximate to the apex 33pt when viewed in plan.

The fourth portion 312b is the range between the top portion 33qt and the position of the fourth side surface 34 most proximate to the top portion 33qt when viewed in plan. That is, each fourth portion 312b is the region between the apex 33qt and the position of the fourth side surface 34 most proximate to the apex 33qt when viewed in plan.

The third portion 312a and the fourth portion 312b are alternately arranged along the path of the coolant.

For example, in the range of the second flow path part 312 between the third portions 312a most proximate to each other along the path of the coolant, a direction D33p that connects the top portions 33pt positioned at the two ends of the range to each other (see FIG. 12) is along the first direction D1 at points within the range.

For example, in the range of the second flow path part 312 between the fourth portions 312b most proximate to each other along the path of the coolant, a direction D33q that connects the top portions 33qt positioned at the two ends of the range (see FIG. 12) is along the first direction D1 at points within the range.

For example, a direction DR2 (which may be called the "second coolant direction DR2" below) in which the coolant flows through the second flow path part 312 is along the first direction D1. In the example, the second coolant direction DR2 changes along the path of the coolant because the communicating path 301 is curved and the third side surface 33 and the fourth side surface 34 meander. In such a case, for example, the second coolant direction DR2 at any location of the second flow path part 312 is along the first direction D1 at the location (in the example, the circumferential direction at the location).

For example, as illustrated in FIG. 13, the second coolant direction DR2 can be a direction connecting the center of the third portion 312a and the center of the fourth portion 312b between the third portion 312a and the fourth portion 312b of the second flow path part 312 adjacent to each other along the path of the coolant.

A direction D13 illustrated in FIG. 13 may be used as the second coolant direction DR2 at any point β inside the communicating path 301. The direction Dβ is perpendicular to the shortest line segment Lβ connecting the third side surface 33 and the fourth side surface 34 when viewed in plan. The line segment Lβ passes through the point β.

Or, in the range of the second flow path part 312 between the third portions 312a adjacent to each other along the path of the coolant, the direction D33p that connects the top portions 33pt positioned at the two ends of the range to each other (see FIG. 12) may be used as the second coolant direction DR2.

Or, in the range of the second flow path part 312 between the fourth portions 312b adjacent to each other along the path of the coolant, the direction D33q that connects the top portions 33qt positioned at the two ends of the range to each other (see FIG. 12) may be used as the second coolant direction DR2.

The width of the second flow path part 312 may be constant. For example, the convex portion 33p (the top portion 33pt) is arranged with the convex portion 34p (the top portion 34pt) in the second direction D2. For example, the concave portion 33q (the top portion 33qt) is arranged with the concave portion 34q (the top portion 34qt) in the second direction D2.

However, according to the embodiment, the width of the second flow path part 312 may not be constant, and may change along the path of the coolant. The convex portion 33p (the top portion 33pt) may be arranged with the concave portion 34q (the top portion 34qt) in the second direction D2 instead of being arranged with the convex portion 34p (the top portion 34pt) in the second direction D2. The concave portion 33q (the top portion 33qt) may be arranged with the convex portion 34p (the top portion 34pt) in the second direction D2 instead of being arranged with the concave portion 34q (the top portion 34qt) in the second direction D2.

Figure 14:
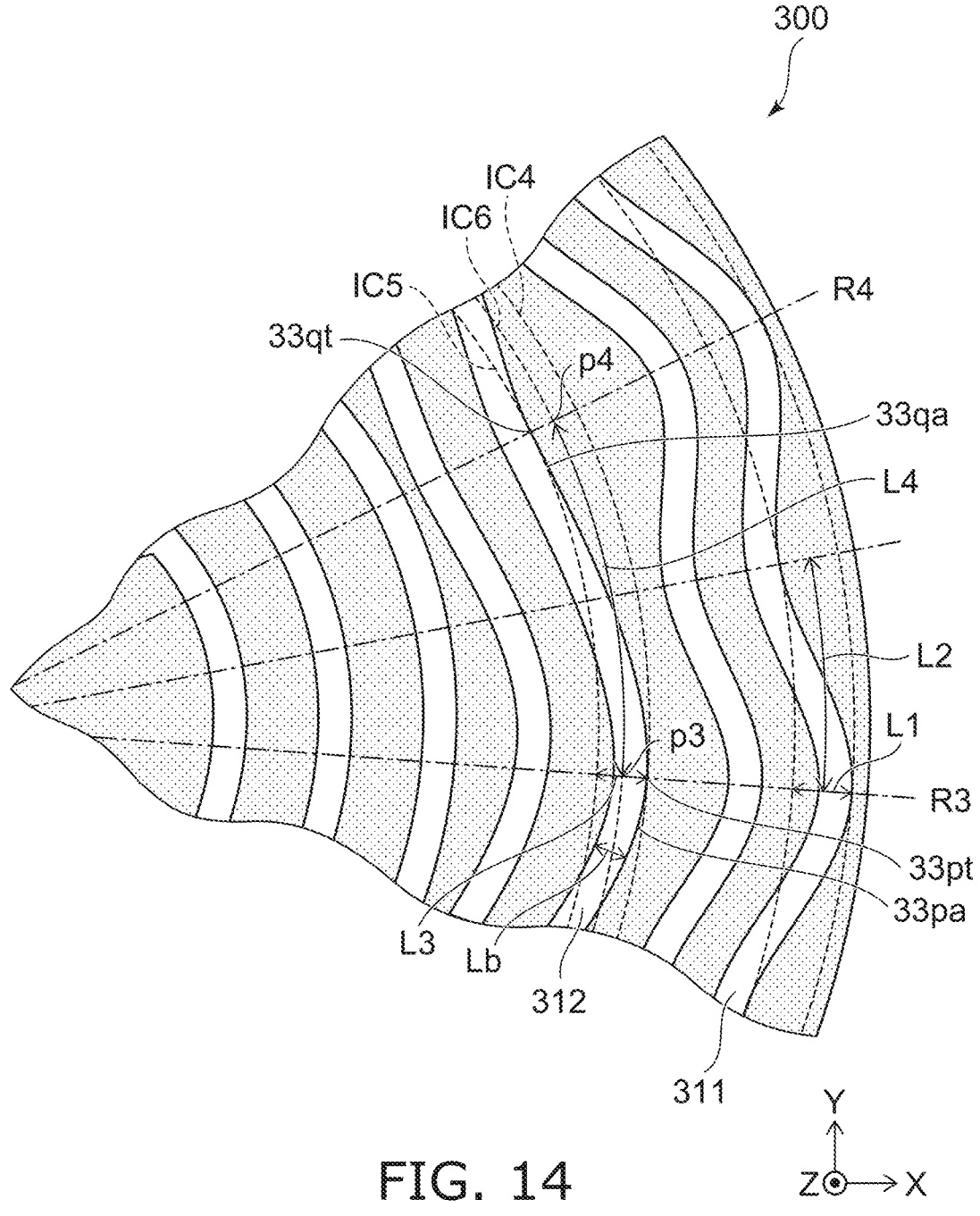
FIG. 14 is a cross-sectional view schematically illustrating a portion of the electrostatic chuck according to the embodiment.

FIG. 14 is a cross-sectional view schematically illustrating a portion of the electrostatic chuck according to the embodiment.

FIG. 14 illustrates an enlarged portion of FIG. 12. The multiple convex portions 33p include a second convex portion 33pa that is one of the convex portions 33p. The multiple concave portions 33q include a second concave portion 33qa that is one of the concave portions 33q. The second concave portion 33qa is adjacent to the second convex portion 33pa and continuous with the second convex portion 33pa. That is, the second concave portion 33qa is the second convex portion 33pa and arranged in the first direction D1 and is the concave portion among the multiple concave portions 33q most proximate to the second convex portion 33pa.

For example, a distance L3 (a third distance) illustrated in FIG. 14 is greater than a distance Lb. The distance Lb is the shortest distance between one side surface (the third side surface 33) and the other side surface (the fourth side surface 34) of the second flow path part 312. That is, the distance Lb is the width of the narrowest portion of the second flow path part 312 when viewed in plan.

The distance L3 corresponds to the distance along the second direction D2 (the second direction D2 at the top portion 33pt or the top portion 33qt) between the top portion 33pt of the second convex portion 33pa and the top portion 33qt of the second concave portion 33qa. For example, the distance L3 corresponds to a length of two times the amplitude of the meandering of the third side surface 33.

More specifically, the distance L3 is the distance (the shortest distance) between a fourth virtual circle IC4 and a fifth virtual circle IC5 illustrated in FIG. 14. The fourth virtual circle IC4 is centered on the center 300c of the base plate 300 and contacts the second convex portion 33pa (the top portion 33pt of the second convex portion 33pa). The fifth virtual circle IC5 is centered on the center 300c of the base plate 300 and contacts the second concave portion 33qa (the top portion 33qt of the second concave portion 33qa). The distance L3 is, for example, not less than 5 millimeters (mm) and not more than 30 mm.

For example, the distance L3 (the third distance) of the second flow path part 312 is less than the distance L1 (the first distance) of the first flow path part 311. When the positions of the first and second flow path parts 311 and 312 of the communicating path 301 extending along the circumferential direction deviate from the design, there are cases where the effects on the temperature distribution due to the misalignment are greater at the first flow path part 311 positioned radially outward of the second flow path part 312 in the base plate 300. In contrast, the first distance of the first flow path part 311 at the outer side is greater than the third distance of the second flow path part at the inner side; therefore, the deviation from the design of the temperature distribution in the placement surface at the first flow path part at the outer side can be further suppressed.

A distance L4 (a fourth distance) illustrated in FIG. 14 is, for example, not less than 30 mm and not more than 140 mm. The distance L2 corresponds to the distance along the first direction D1 between the top portion 33pt of the second convex portion 33pa and the top portion 33qt of the second concave portion 33qa. For example, the distance L4 corresponds to the length of half of the meandering period of the third side surface 33.

More specifically, the distance L4 is the distance along the first direction D1 (the circumferential direction) between a point p3 and a point p4 illustrated in FIG. 14.

The point p3 is the intersection between a sixth virtual circle IC6 and a third radial line R3. The point p4 is the intersection between the sixth virtual circle IC6 and a fourth radial line R4. The sixth virtual circle IC6 is centered on the center 300c of the base plate 300 and positioned between the fourth virtual circle IC4 and the fifth virtual circle IC5. The distance (the shortest distance) between the fourth virtual circle IC4 and the sixth virtual circle IC6 is equal to the distance (the shortest distance) between the fifth virtual circle IC5 and the sixth virtual circle IC6. The third radial line R3 is a straight line that passes through the center 300c of the base plate 300 and the second convex portion 33pa (the top portion 33pt of the second convex portion 33pa). The fourth radial line R4 is a straight line that passes through the center 300c of the base plate 300 and the second concave portion 33qa (the top portion 33qt of the second concave portion 33qa).

For example, the distance L4 (the fourth distance) of the second flow path part 312 is greater than the distance L2 (the second distance) of the first flow path part 311. The second distance (e.g., the meandering period) of the first flow path part 311 at the outer side is less than the fourth distance (e.g., the meandering period) of the second flow path part 312 at the inner side; therefore, the deviation from the design of the temperature distribution in the placement surface at the first flow path part at the outer side can be further suppressed.

A description similar to the description related to the shapes of the concave portion and the convex portion provided in the third side surface 33 is applicable to the shapes of the concave portion and the convex portion provided in the fourth side surface 34.

Figure 15:
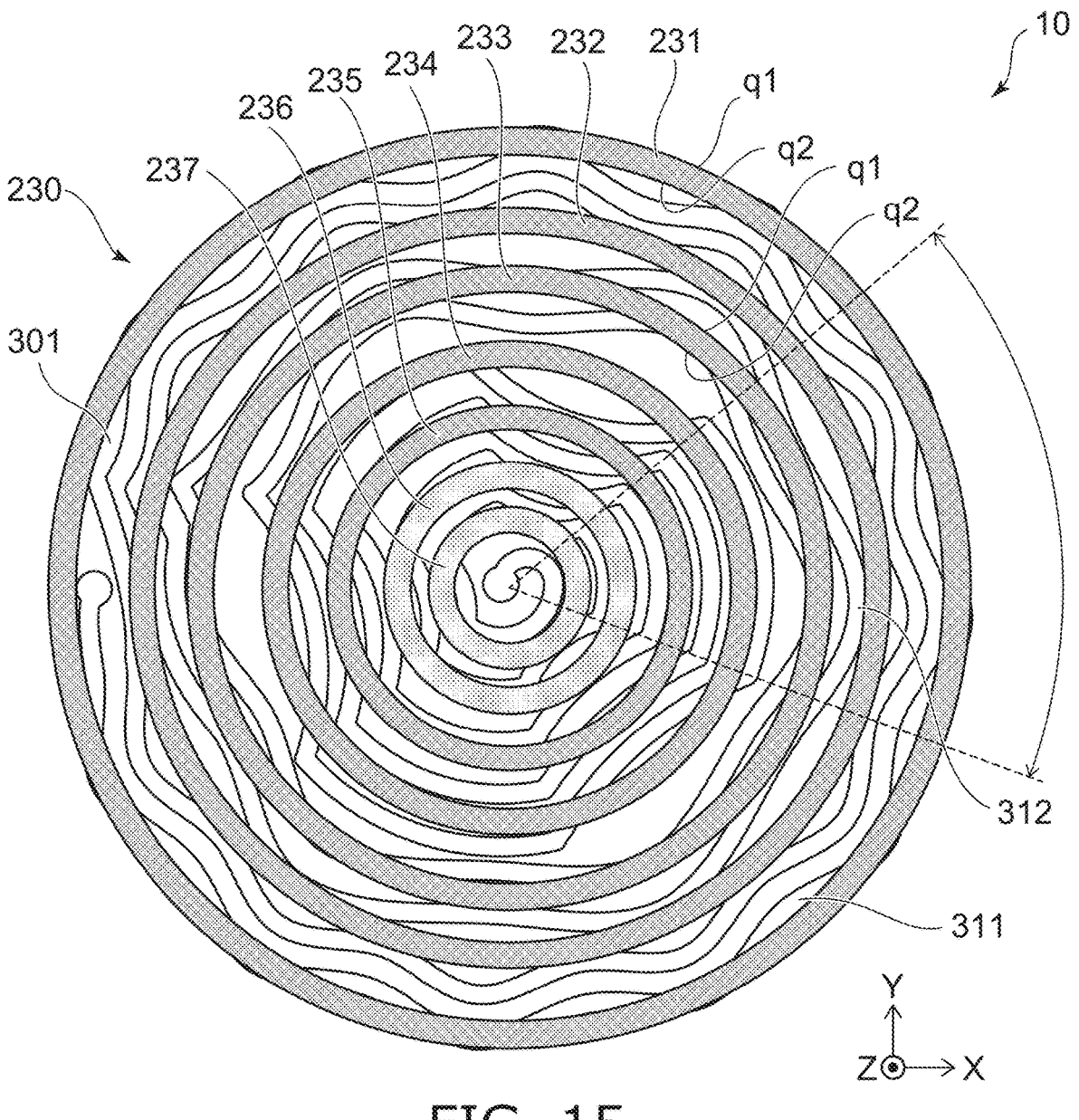
FIG. 15 is a perspective plan view schematically illustrating a portion of the electrostatic chuck according to the embodiment.
Figure 16A:
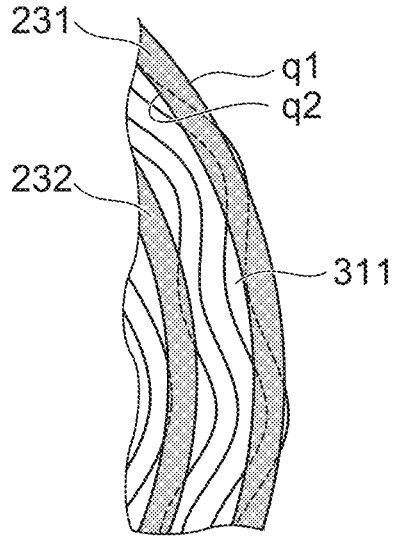
FIG. 16A, and FIG. 16B are perspective plan views schematically illustrating portions of the electrostatic chuck according to the embodiment.
Figure 16B:
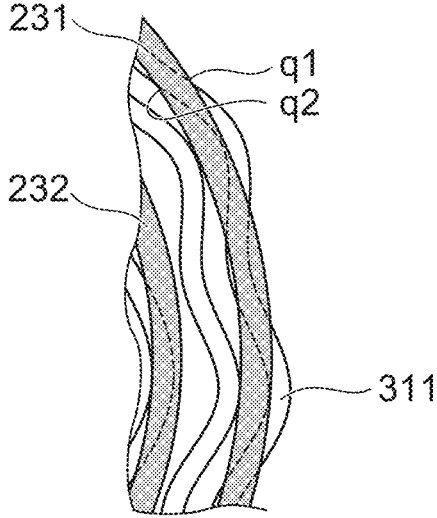

FIG. 15, FIG. 16A, and FIG. 16B are perspective plan views schematically illustrating portions of the electrostatic chuck according to the embodiment.

FIG. 15 illustrates the heater element 230 of the electrostatic chuck 11 and the communicating path 301. In the example, the heater element 230 includes the first to seventh heater lines 231 to 237. The planar shapes of the heater lines are, for example, annular shapes.

FIGS. 16A and 16B each correspond to portions of the heater element 230 and the communicating path 301 illustrated in FIG. 15. FIG. 16A illustrates when the relative position of the communicating path 301 with respect to the heater unit 200 does not deviate from the design. FIG. 16B illustrates when the relative position of the communicating path 301 with respect to the heater unit 200 deviates from the design.

As illustrated in FIGS. 16A and 16B, at least one of the pair of sides of the first heater line 231 overlaps the first flow path part 311 in the Z-direction. As illustrated in FIG. 15, for example, at least one of the pair of sides of a third heater line 233 overlaps the second flow path part 312 in the Z-direction. Accordingly, the deviation from the design of the temperature distribution in the placement surface can be further suppressed when the position of the communicating path 301 with respect to the heater unit 200 deviates from the design.

For example, the second flow path part 312 overlaps the second and third heater lines 232 and 233 in the Z-direction. The second flow path part 312 may overlap only one heater line or may overlap multiple heater lines.

Figure 17:
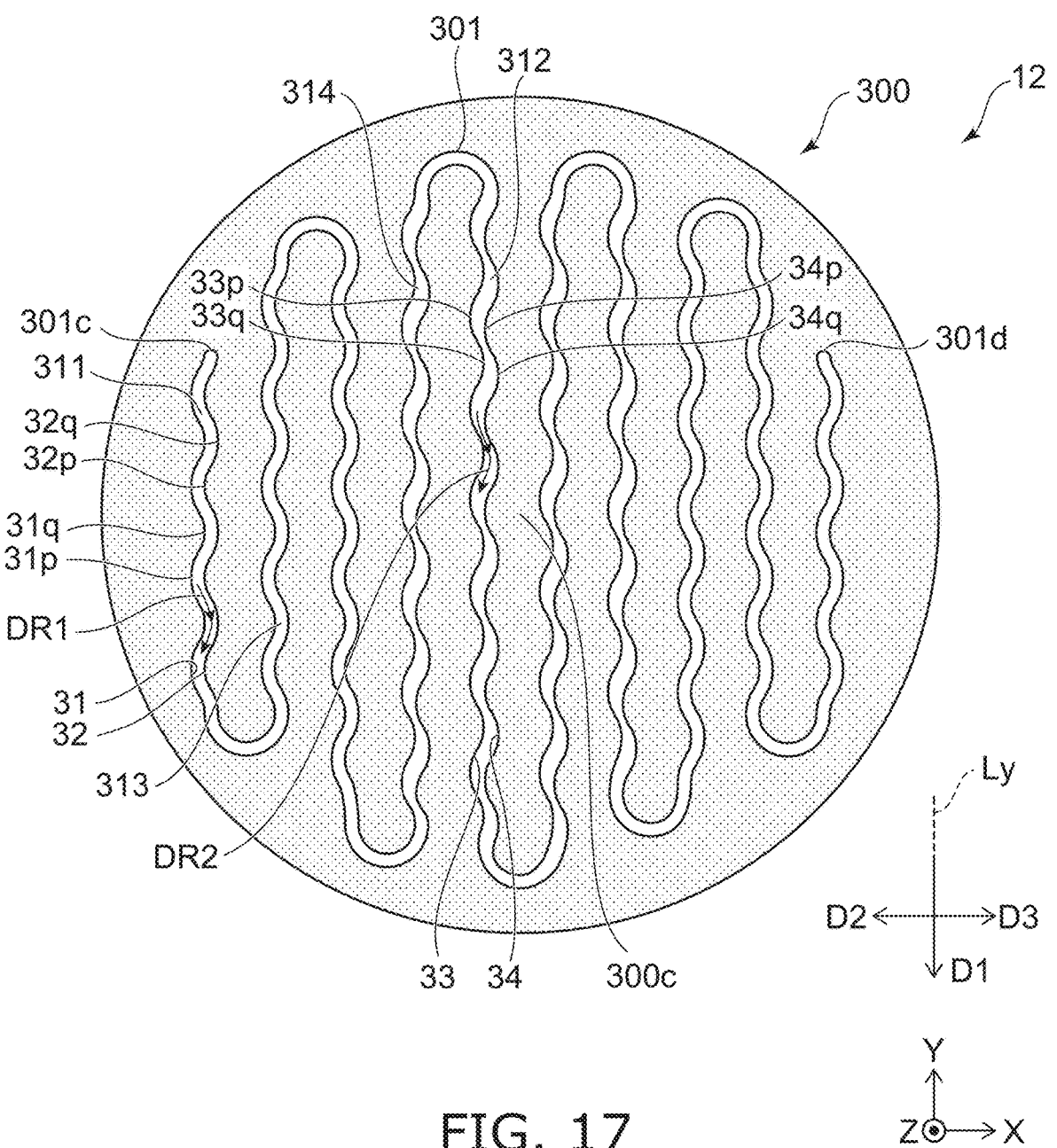
FIG. 17 is a cross-sectional view schematically illustrating a portion of another electrostatic chuck according to the embodiment.

FIG. 17 is a cross-sectional view schematically illustrating a portion of another electrostatic chuck according to the embodiment.

FIG. 17 illustrates the planar shape of the base plate 300 and the communicating path 301 of the electrostatic chuck 12 according to the embodiment when viewed from above. The planar shape of the communicating path 301 of the electrostatic chuck 12 is different from that of the electrostatic chuck 10 in that the planar shape is, for example, a zigzag configuration or a snake-like shape instead of a spiral shape. In the example, the first direction D1 represents directions on a straight line Ly parallel to the Y-direction, and is the Y-direction or the opposite direction of the Y-direction. The second direction D2 is perpendicular to the first direction D1.

In the electrostatic chuck 12 as well, the communicating path 301 includes the first flow path part 311. The first flow path part 311 includes the first side surface 31 and the second side surface 32. For example, the first flow path part 311, the first side surface 31, and the second side surface 32 each extend along the first direction D1 while meandering. The first side surface 31 includes the multiple convex portions 31p and the multiple concave portions 31q. The second side surface 32 includes the multiple convex portions 32p and the multiple concave portions 32q. The direction that connects the top portions of the convex portions 31p among the multiple convex portions 31p most proximate to each other is along the first direction D1 and is, for example, parallel to the first direction D1. The direction that connects the top portions of the concave portions 31q among the multiple concave portions 31q most proximate to each other is along the first direction D1 and is, for example, parallel to the first direction D1.

For example, multiple first flow path parts 311 may be provided, and may be arranged in the second direction D2. The communicating path 301 may include a flow path part 313 adjacent to the first flow path part 311 in the second direction D2. The flow of the coolant in the flow path part 313 is along the opposite direction of the first direction D1. Otherwise, the shape of the flow path part 313 may be similar to that of the first flow path part 311. In other words, for example, the flow path part 313 extends along the first direction D1 while meandering. For example, the pair of side surfaces of the flow path part 313 each extend along the first direction D1 while meandering. The pair of side surfaces of the flow path part 313 each include multiple convex portions that are convex in the second direction D2, and multiple concave portions that are convex in the direction D3. The communicating path 313 and the first flow path part 311 are connected by a bent portion of the communicating path 301.

The communicating path 301 also includes the second flow path part 312. The second flow path part 312 includes the third side surface 33 and the fourth side surface 34. For example, the second flow path part 312, the third side surface 33, and the fourth side surface 34 each extend along the first direction D1 while meandering. The third side surface 33 includes the multiple convex portions 33p and the multiple concave portions 33q. The fourth side surface 34 includes the multiple convex portions 34p and the multiple concave portions 34q. The direction that connects the top portions of the convex portions 33p among the multiple convex portions 33p most proximate to each other is along the first direction D1 and is, for example, parallel to the first direction D1. The direction that connects the top portions of the concave portions 33q among the multiple concave portions 33q most proximate to each other is along the first direction D1 and is, for example, parallel to the first direction D1.

For example, multiple second flow path parts 312 may be provided, and may be arranged in the second direction D2. The communicating path 301 may include a flow path part 314 adjacent to the second flow path part 312 in the second direction D2. The flow of the coolant in the flow path part 314 is along the opposite direction of the first direction D1. Otherwise, the shape of the flow path part 314 may be similar to that of the second flow path part 312. In other words, for example, the flow path part 314 extends along the first direction D1 while meandering. For example, the pair of side surfaces of the flow path part 314 each extend along the first direction D1 while meandering. The pair of side surfaces of the flow path part 314 each include multiple convex portions that are convex in the second direction D2, and multiple concave portions that are convex in the direction D3. The flow path part 314 and the second flow path part 312 are connected by a bent portion of the communicating path 301.

Figure 18:
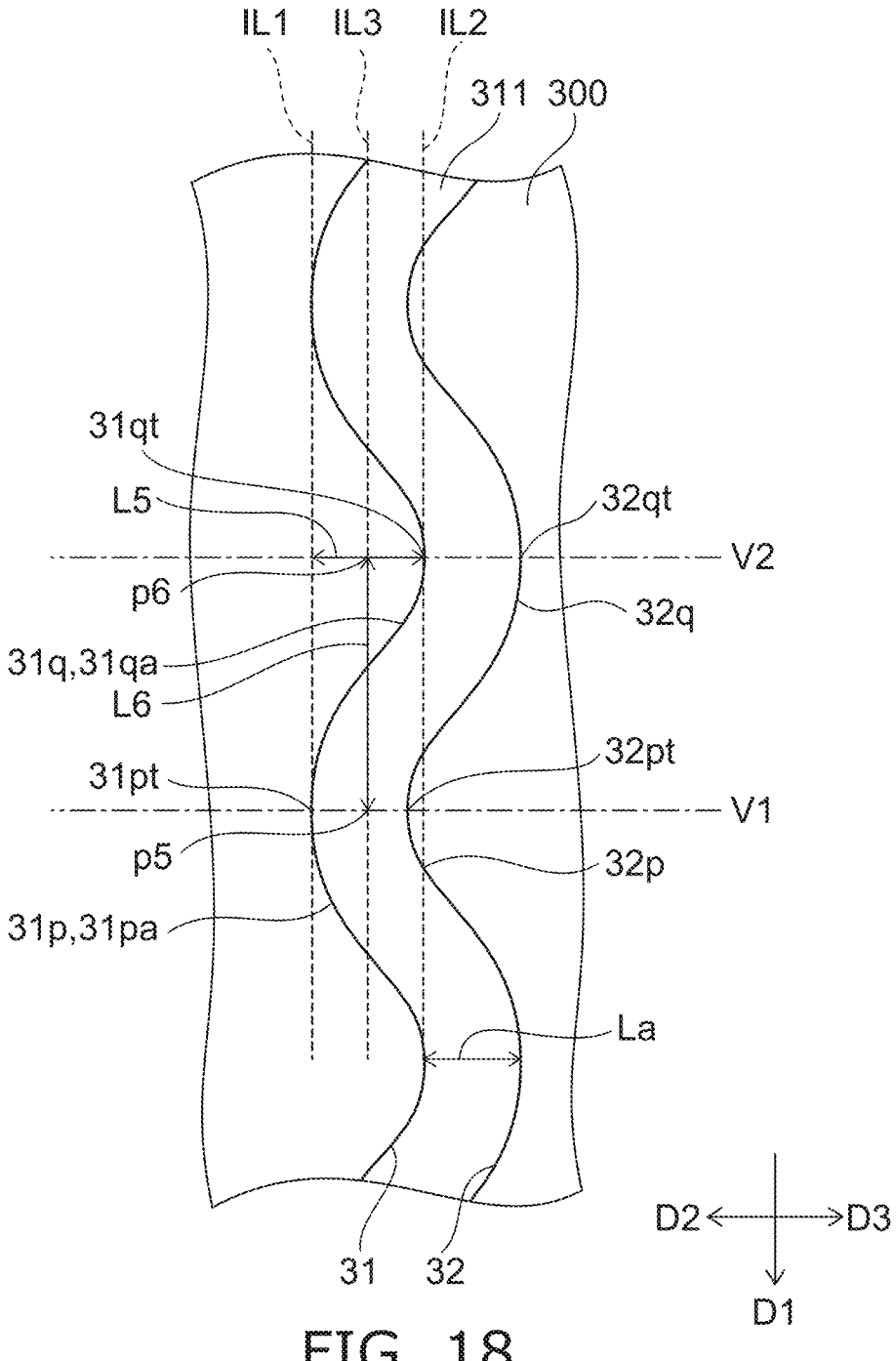
FIG. 18 is a cross-sectional view schematically illustrating a portion of another electrostatic chuck according to the embodiment.

FIG. 18 is a cross-sectional view schematically illustrating a portion of another electrostatic chuck according to the embodiment.

FIG. 18 illustrates an enlarged portion of the first flow path part 311 illustrated in FIG. 17.

The multiple convex portions 31p include the first convex portion 31pa that is one of the convex portions 31p. The multiple concave portions 31q include the first concave portion 31qa that is one of the concave portions 31q.

A distance L5 (a fifth distance) illustrated in FIG. 18 is, for example, greater than the distance La. The distance La is the shortest distance between one side surface (the first side surface 31) to the other side surface (the second side surface 32) of the first flow path part 311.

The distance L5 is the distance (the shortest distance) between a first straight line IL1 and a second straight line IL2 illustrated in FIG. 18. The first straight line IL1 is a straight line that extends in the first direction D1 and contacts the first convex portion 31pa (the top portion 31pt of the first convex portion 31pa). The second straight line IL2 is a straight line that extends in the first direction D1 and contacts the first concave portion 31qa (the top portion 31qt of the first concave portion 31qa). The distance L5 is, for example, not less than 5 millimeters (mm) and not more than 30 mm.

A distance L6 (a sixth distance) illustrated in FIG. 18 is, for example, not less than 30 mm and not more than 140 mm. The distance L6 is the distance along the first direction D1 between a point p5 and a point p6 illustrated in FIG. 18. The point p5 is the intersection between a third straight line IL3 and a first perpendicular line V1. The point p6 is the intersection between the third straight line IL3 and a second perpendicular line V2. The third straight line IL3 is a straight line positioned between the first straight line IL1 and the second straight line IL2. The distance (the shortest distance) between the first straight line IL1 and the third straight line IL3 is equal to the distance (the shortest distance) between the second straight line IL2 and the third straight line IL3. The first perpendicular line V1 is a straight line that passes through the first convex portion 31pa (the top portion 31pt of the first convex portion 31pa) and is perpendicular to the first straight line IL1. The second perpendicular line V2 is a straight line that passes through the first concave portion 31qa (the top portion 31qt of the first concave portion 31qa) and is perpendicular to the second straight line IL2.

By setting the fifth distance (e.g., the meandering amount of the side surface of the communicating path) to be relatively long, the deviation from the design of the temperature distribution in the placement surface can be suppressed even when the misalignment of the communicating path when manufacturing the electrostatic chuck is slightly large. The deviation from the design of the temperature distribution in the placement surface accompanying the misalignment of the communicating path can be further suppressed because the sixth distance (e.g., the meandering period of the side surface of the communicating path) is short.

In the example of FIG. 18, the convex portion 31p (the top portion 31pt) is arranged with the convex portion 32p (the top portion 32pt) in the second direction D2. The concave portion 31q (the top portion 31qt) is arranged with the concave portion 32q (the top portion 32qt) in the second direction D2. Accordingly, the width of the first flow path part 311 can be constant. However, the convex portion 31p (the top portion 31pt) may not be arranged with the convex portion 32p (the top portion 32pt) in the second direction D2. The concave portion 31q (the top portion 31qt) may not be arranged with the concave portion 32q (the top portion 32qt) in the second direction D2.

Figure 19:
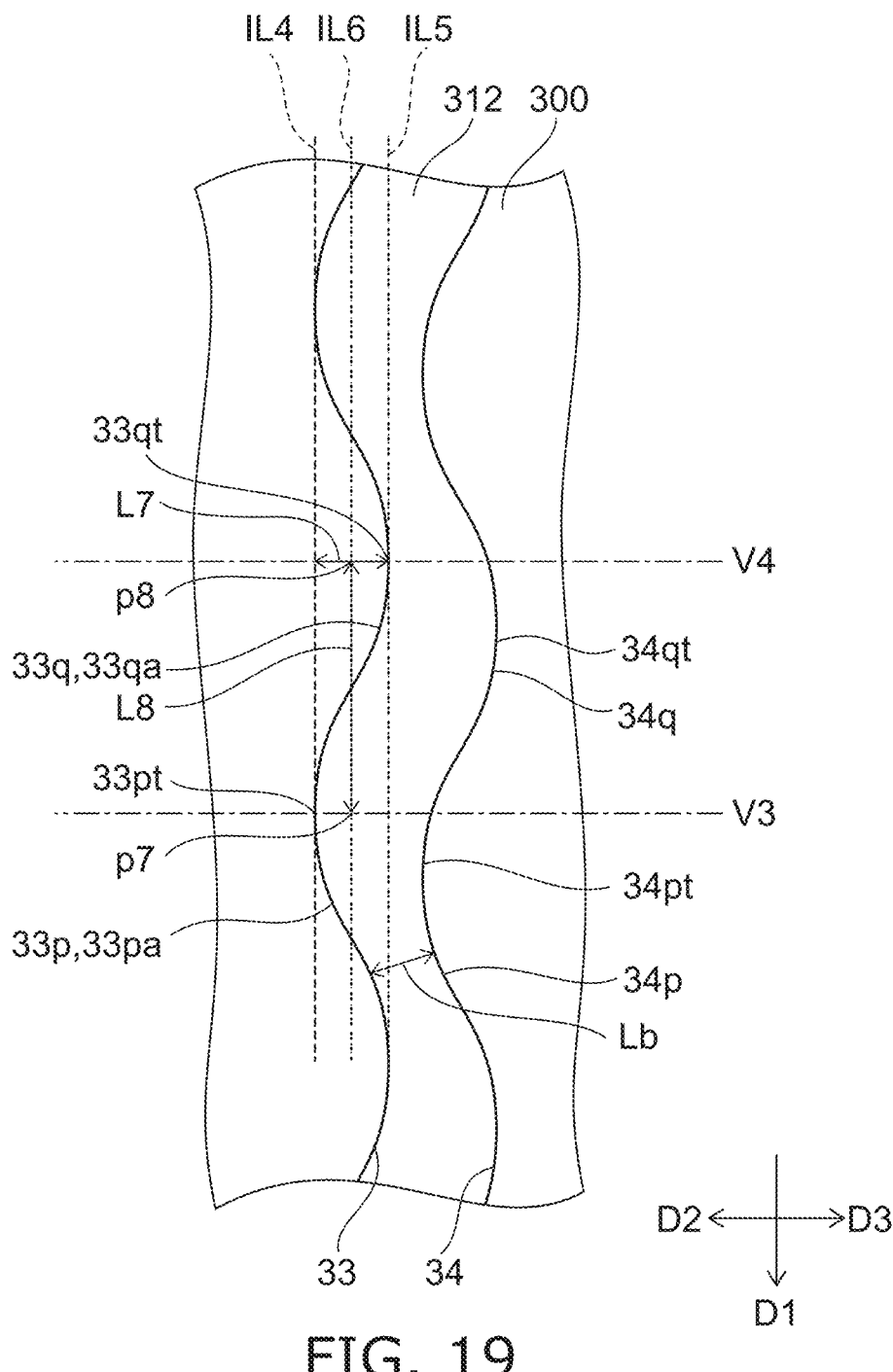
FIG. 19 is a cross-sectional view schematically illustrating a portion of another electrostatic chuck according to the embodiment.

FIG. 19 is a cross-sectional view schematically illustrating a portion of another electrostatic chuck according to the embodiment.

FIG. 19 illustrates an enlarged portion of the first flow path part 311 illustrated in FIG. 17.

The multiple convex portions 33p include the second convex portion 33pa that is one of the convex portions 33p. The multiple concave portions 33q include the second concave portion 33qa that is one of the concave portions 33q.

A distance L7 illustrated in FIG. 19 is greater than the distance Lb. The distance Lb is the shortest distance between one side surface (the third side surface 33) and the other side surface (the fourth side surface 34) of a second flow path part 332.

The distance L7 is the distance (the shortest distance) between a fourth straight line IL4 and a fifth straight line IL5 illustrated in FIG. 19. The fourth straight line IL4 is a straight line that extends in the first direction D1 and contacts the second convex portion 33pa (the top portion 33pt of the second convex portion 33pa). The fifth straight line IL5 is a straight line that extends in the first direction D1 and contacts the second concave portion 33qa (the top portion 33qt of the second concave portion 33qa). The distance L7 is, for example, not less than 5 millimeters (mm) and not more than 30 mm.

A distance L8 illustrated in FIG. 19 is, for example, not less than 30 mm and not more than 140 mm. The distance L8 is the distance along the first direction D1 between a point p7 and a point p8 illustrated in FIG. 19. The point p7 is the intersection between a sixth straight line IL6 and a third perpendicular line V3. The point p8 is the intersection between the sixth straight line IL6 and a fourth perpendicular line V4. The sixth straight line IL6 is a straight line positioned between the fourth straight line IL4 and the fifth straight line IL5. The distance (the shortest distance) between the fourth straight line IL4 and the sixth straight line IL6 is equal to the distance (the shortest distance) between the fifth straight line IL5 and the sixth straight line IL6. The third perpendicular line V3 is a straight line that passes through the second convex portion 33pa (the top portion 33pt of the second convex portion 33pa) and is perpendicular to the fourth straight line IL4. The fourth perpendicular line V4 is a straight line that passes through the second concave portion 33qa (the top portion 33qt of the second concave portion 33qa) and is perpendicular to the fifth straight line IL5.

In the example of FIG. 19, the convex portion 33*p* (the top portion 33*pt*) is not arranged with the convex portion 34*p* (the top portion 34*pt*) in the second direction D2. The concave portion 33*q* (the top portion 33*qt*) is not arranged with the concave portion 34*q* (the top portion 34*qt*) in the second direction D2. That is, the width of the second flow path part 312 changes along the first direction. For example, the flow of the coolant inside the second flow path part 312 can be disturbed thereby, and the cooling effect can be increased. However, the convex portion 33*p* (the top portion 33*pt*) may be arranged with the convex portion 34*p* (the top portion 34*pt*) in the second direction D2. The concave portion 33*q* (the top portion 33*qt*) may be arranged with the concave portion 34*q* (the top portion 34*qt*) in the second direction D2.

Thus, according to embodiments, an electrostatic chuck is provided in which the effects of misalignment of the coolant flow path can be suppressed. For example, the uniformity of the in-plane temperature distribution of the process object can be increased.

The invention has been described with reference to the embodiments. However, the invention is not limited to these embodiments. Any design changes in the above embodiments suitably made by those skilled in the art are also encompassed within the scope of the invention as long as they fall within the spirit of the invention. For example, the shape, the size the material, the disposition and the arrangement or the like of the components included in the electrostatic chuck are not limited to illustrations and can be changed appropriately.

The components included in the embodiments described above can be combined to the extent possible, and these combinations are also encompassed within the scope of the invention as long as they include the features of the invention.

What is claimed is:

1. An electrostatic chuck, comprising:

a ceramic dielectric substrate having a placement surface configured to have a process object placed thereon; and a base plate supporting the ceramic dielectric substrate, the base plate having an upper surface at the ceramic dielectric substrate side, and a lower surface opposite to the upper surface, the base plate including a communicating path located between the upper surface and the lower surface, the communicating path being configured to allow a coolant to pass, the communicating path having a spiral shape when viewed along a stacking direction of the base plate and the ceramic dielectric substrate, the communicating path including a first flow path part, the first flow path part being a portion of an outermost circumference of the spiral shape and having a pair of side surfaces along a first direction, the first direction being along a flow of the coolant, when viewed along the stacking direction of the base plate and the ceramic dielectric substrate, one side surface of the pair of side surfaces including a plurality of convex portions that is convex in a second direction, the second direction being perpendicular to the first direction from the other side surface toward the one side surface of the pair of side surfaces, and a plurality of concave portions that is convex in an opposite direction of the second direction, the plurality of convex portions and the plurality of concave portions being alternately arranged;

the chuck further comprising:

a heater unit located inside the ceramic dielectric substrate or between the ceramic dielectric substrate and the base plate, the heater unit heating the ceramic dielectric substrate, the heater unit including a heater line, the heater line having a pair of sides extending along an extension direction of the heater line, at least a portion of one of the pair of sides overlapping the first flow path part in the stacking direction.

2. The chuck according to claim 1, wherein when viewed along the stacking direction, the other side surface of the pair of side surfaces includes:

a plurality of convex portions that is convex in the second direction; and a plurality of concave portions that is convex in an opposite direction of the second direction, and the plurality of convex portions of the other side surface and the plurality of concave portions of the other side surface are alternately arranged.

3. The chuck according to claim 1, wherein the first direction is a circumferential direction of the base plate, the plurality of convex portions of the one side surface includes a first convex portion, the plurality of concave portions of the one side surface includes a first concave portion adjacent to the first convex portion, a first virtual circle is centered on a center of the base plate and contacts the first convex portion, and a second virtual circle is centered on the center of the base plate and contacts the first concave portion, and a first distance between the first virtual circle and the second virtual circle is greater than a shortest distance between the one side surface and the other side surface.

4. The chuck according to claim 3, wherein the first distance is not less than 5 millimeters.

5. The chuck according to claim 3, wherein the communicating path includes a second flow path part having a pair of side surfaces arranged in a radial direction of the base plate, when viewed along the stacking direction, one side surface of the pair of side surfaces of the second flow path part includes:

a plurality of convex portions that is convex in the second direction; and a plurality of concave portions that is convex in an opposite direction of the second direction, the plurality of convex portions of the second flow path part and the plurality of concave portions of the second flow path part are alternately arranged, the second flow path part is positioned radially inward of the first flow path part in the base plate, the plurality of convex portions of the second flow path part includes a second convex portion, the plurality of concave portions of the second flow path part includes a second concave portion, a fourth virtual circle is centered on the center of the base plate and contacts the second convex portion, a fifth virtual circle is centered on the center of the base plate and contacts the second concave portion, a third distance is a distance between the fourth virtual circle and the fifth virtual circle, and the first distance is greater than the third distance.

6. The chuck according to claim 1, wherein the first direction is a circumferential direction of the base plate, the plurality of convex portions of the one side surface includes a first convex portion, the plurality of concave portions of the one side surface includes a first concave portion adjacent to the first convex portion, a first virtual circle is centered on a center of the base plate and contacts the first convex portion, a second virtual circle is centered on the center of the base plate and contacts the first concave portion, a third virtual circle is equidistant from the first virtual circle and the second virtual circle, a first radial line is a straight line connecting the first convex portion and the center of the base plate, a second radial line is a straight line connecting the first concave portion and the center of the base plate, and a second distance along the circumferential direction between an intersection between the first radial line and the third virtual circle and an intersection between the second radial line and the third virtual circle is not less than 30 millimeters and not more than 140 millimeters.

7. The chuck according to claim 6, wherein the communicating path includes a second flow path part having a pair of side surfaces arranged in a radial direction of the base plate, when viewed along the stacking direction, one side surface of the pair of side surfaces of the second flow path part includes:

a plurality of convex portions that is convex in the second direction; and a plurality of concave portions that is convex in an opposite direction of the second direction, the plurality of convex portions of the second flow path part and the plurality of concave portions of the second flow path part are alternately arranged, the second flow path part is positioned radially inward of the first flow path part in the base plate, the plurality of convex portions of the second flow path part includes a second convex portion, the plurality of concave portions of the second flow path part includes a second concave portion, a fourth virtual circle is centered on the center of the base plate and contacts the second convex portion, a fifth virtual circle is centered on the center of the base plate and contacts the first concave portion, a sixth virtual circle is equidistant from the fourth virtual circle and the fifth virtual circle, a third radial line is a straight line connecting the second convex portion and the center of the base plate, a fourth radial line is a straight line connecting the second concave portion and the center of the base plate, a fourth distance is a distance along the circumferential direction between an intersection between the third radial line and a sixth virtual circle and an intersection between a fourth radial line and the sixth virtual circle, and the second distance is less than the fourth distance.

8. The chuck according to claim 1, wherein the first direction is a circumferential direction of the base plate, and the one side surface is positioned radially outward of the other side surface in the base plate.

9. The chuck according to claim 1, wherein the extension direction is a same direction as the first direction.

* * * * *